(12) United States Patent
Kohyama et al.

(10) Patent No.: US 6,608,356 B1
(45) Date of Patent: *Aug. 19, 2003

(54) SEMICONDUCTOR DEVICE USING DAMASCENE TECHNIQUE AND MANUFACTURING METHOD THEREFOR

(75) Inventors: Yusuke Kohyama, Yokosuka (JP); Nobuo Hayasaka, Yokosuka (JP); Katsuya Okumura, Yokohama (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/892,110

(22) Filed: Jul. 14, 1997

(30) Foreign Application Priority Data

Jul. 12, 1996 (JP) ............................................. 8-183337

(51) Int. Cl.⁷ ..................... H01L 29/76; H01L 29/94; H01L 31/062; H01L 31/113
(52) U.S. Cl. ..................... 257/412; 257/413; 257/388; 257/410
(58) Field of Search ............................... 257/296, 412, 257/413, 250, 384, 410, 411, 388; 438/595, 596, 581, 265, 184, 195, 199, 153

(56) References Cited

U.S. PATENT DOCUMENTS

| | | | | |
|---|---|---|---|---|
| 5,132,756 A | * | 7/1992 | Matsuda | 257/653 |
| 5,214,305 A | * | 5/1993 | Huang et al. | 257/413 |
| 5,356,834 A | * | 10/1994 | Sugimoto et al. | |
| 5,405,791 A | * | 4/1995 | Ahmad et al. | 438/228 |
| 5,545,578 A | * | 8/1996 | Park et al. | 438/303 |
| 5,616,961 A | * | 4/1997 | Kohyama | 257/758 |
| 5,635,746 A | * | 6/1997 | Kimura et al. | 257/412 |
| 5,668,394 A | * | 9/1997 | Lur et al. | 257/413 |
| 5,726,479 A | * | 3/1998 | Matsumoto et al. | 257/344 |
| 5,731,242 A | * | 3/1998 | Parat et al. | 438/586 |
| 5,739,573 A | * | 4/1998 | Kawaguchi | 257/384 |
| 5,759,889 A | * | 6/1998 | Sakao | 438/241 |
| 5,767,530 A | * | 6/1998 | Ha | 257/72 |
| 5,767,554 A | * | 6/1998 | Ikeda et al. | 257/393 |
| 5,776,822 A | * | 7/1998 | Fujii et al. | 438/586 |
| 5,783,475 A | * | 7/1998 | Ramaswami | 438/303 |
| 5,818,085 A | * | 10/1998 | Hsu et al. | 257/347 |
| 5,856,690 A | * | 1/1999 | Burns et al. | 257/315 |
| 5,907,188 A | * | 5/1999 | Nakajima et al. | 257/751 |

FOREIGN PATENT DOCUMENTS

| | | |
|---|---|---|
| JP | 06163535 A | 6/1994 |
| JP | 06275612 A | 9/1994 |
| JP | 07130733 A | 5/1995 |
| JP | 07161848 A | 6/1995 |
| JP | 07307338 A | 11/1995 |

OTHER PUBLICATIONS

Kaga et al., "Crown–Shaped Stacked–Capacitor Cell for 1.5–V Operation 64–Mb DRAM's", IEEE Transactions on Electron Devices, vol. 38, No. 2, Feb. 1991, pp. 255–261.*

* cited by examiner

*Primary Examiner*—Phat X. Cao
(74) *Attorney, Agent, or Firm*—Banner, Witcoff Ltd.

(57) ABSTRACT

A gate insulation film is formed on semiconductor substrate, a gate electrodes are formed on the gate insulation film, and source/drain diffusion layers are formed. Silicon nitride films are formed on a side wall of the gate electrodes, a silicon oxide film is formed on the overall surface, and the silicon oxide film is etched back to have the same height as that of the gate electrodes so that the surface is flattened, and then the surface of the gate electrodes are etched by a predetermined thickness to form a first stepped portion from the silicon oxide film, the first stepped portion is filled up by a tungsten film, the surface of the tungsten film is etched by a predetermined thickness so that a second stepped portion is formed, and then the second stepped portion is filled by a silicon nitride film.

14 Claims, 16 Drawing Sheets

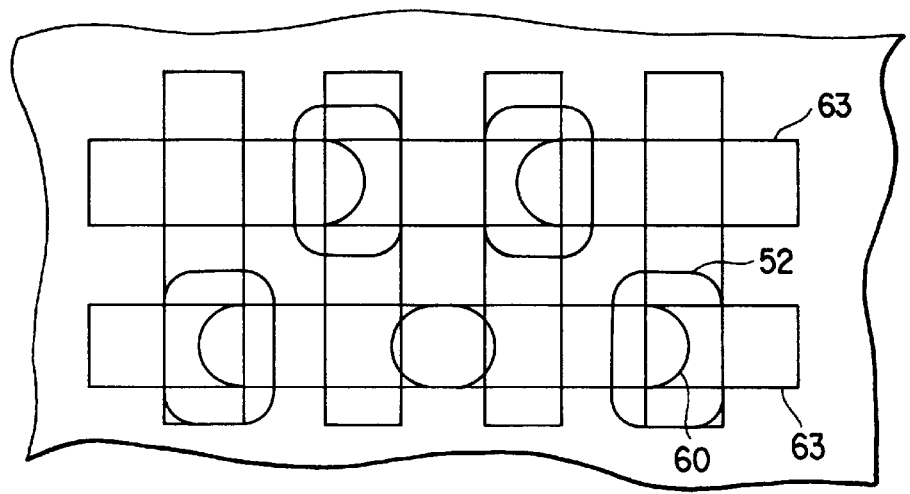
F I G. 8
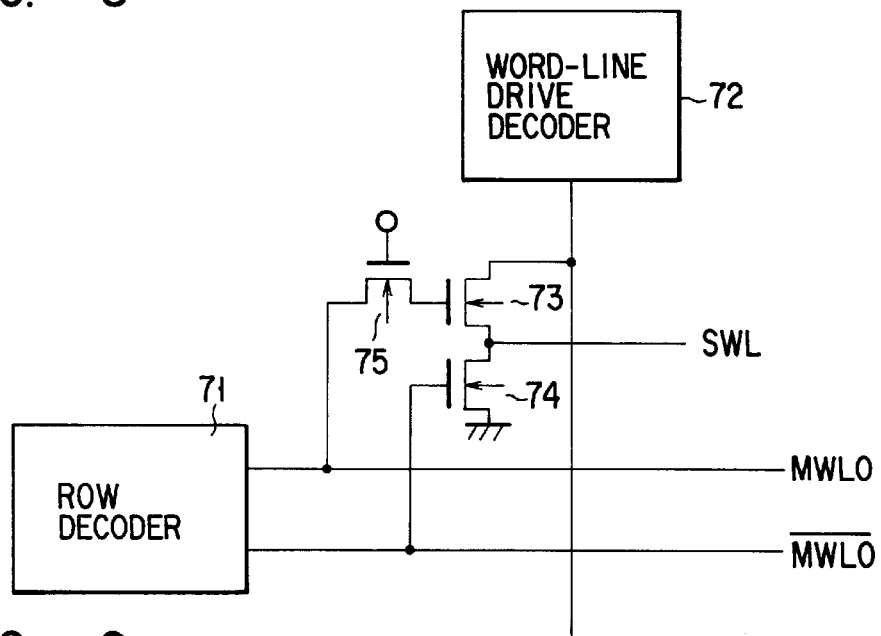
F I G. 9
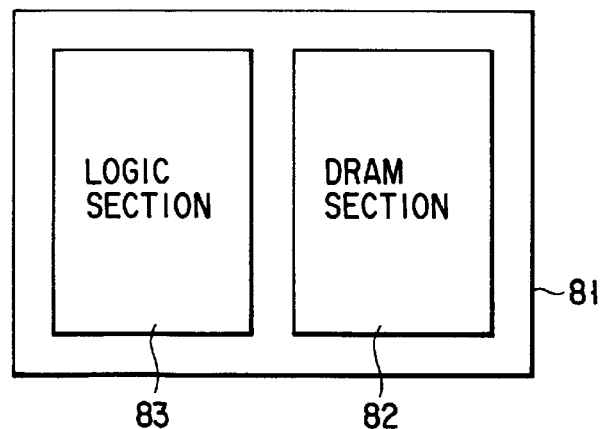
F I G. 10

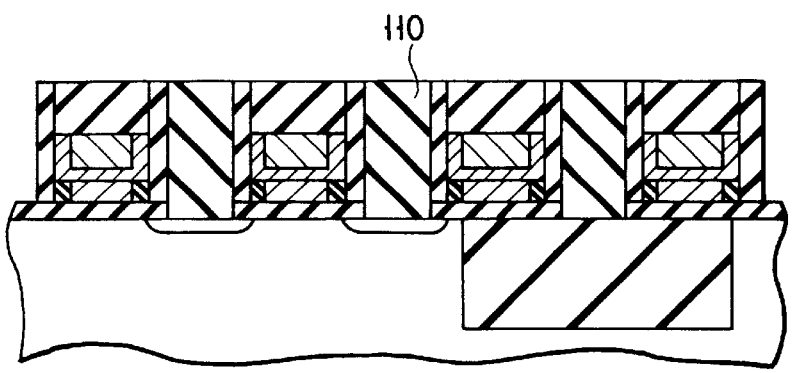
F I G. 15
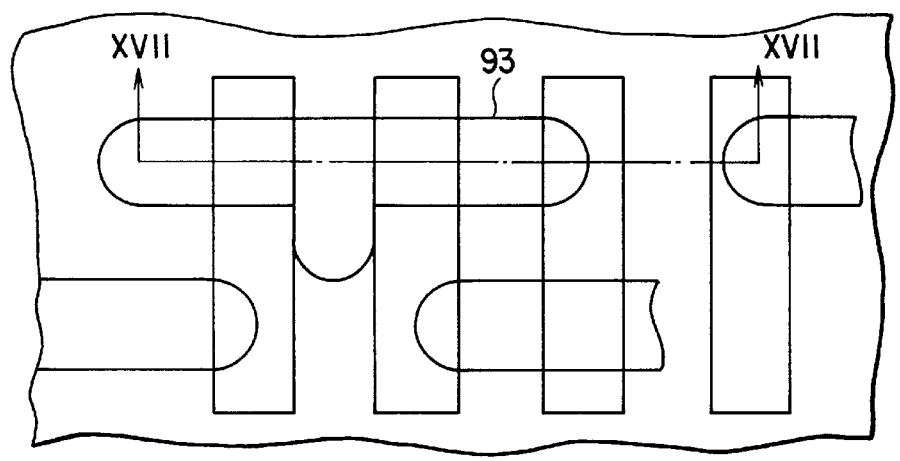
F I G. 16
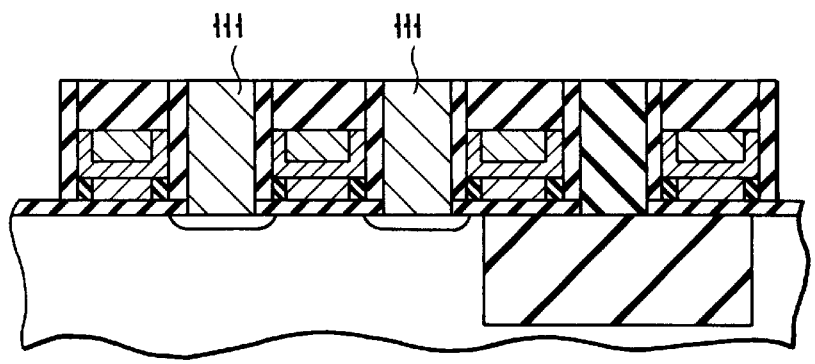
F I G. 17

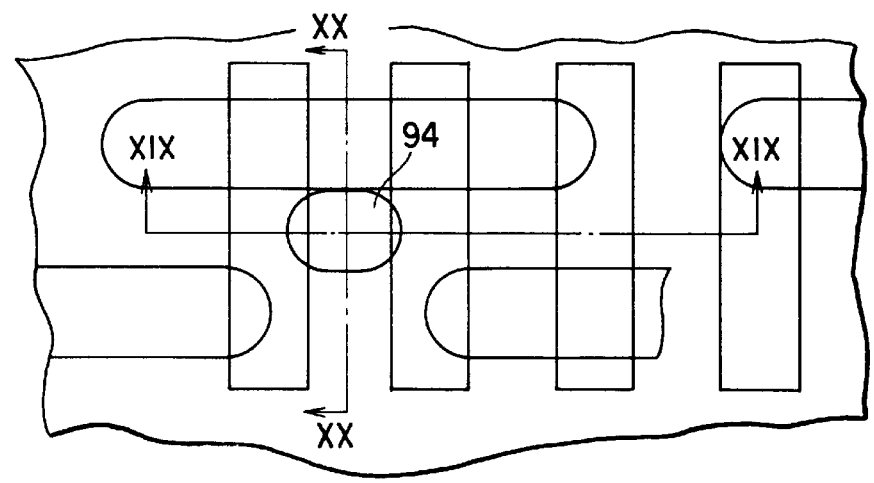
F I G. 18
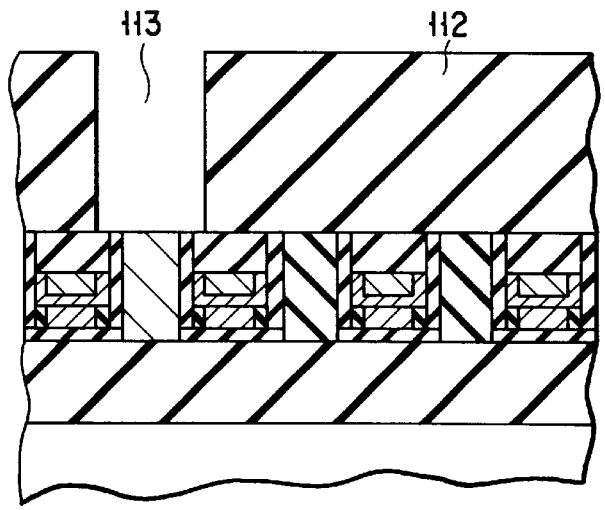
F I G. 19
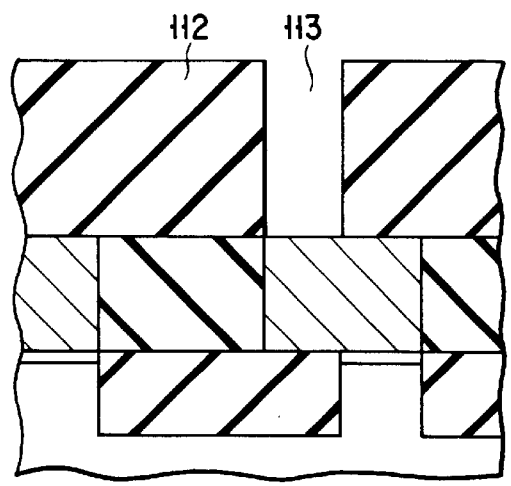
F I G. 20

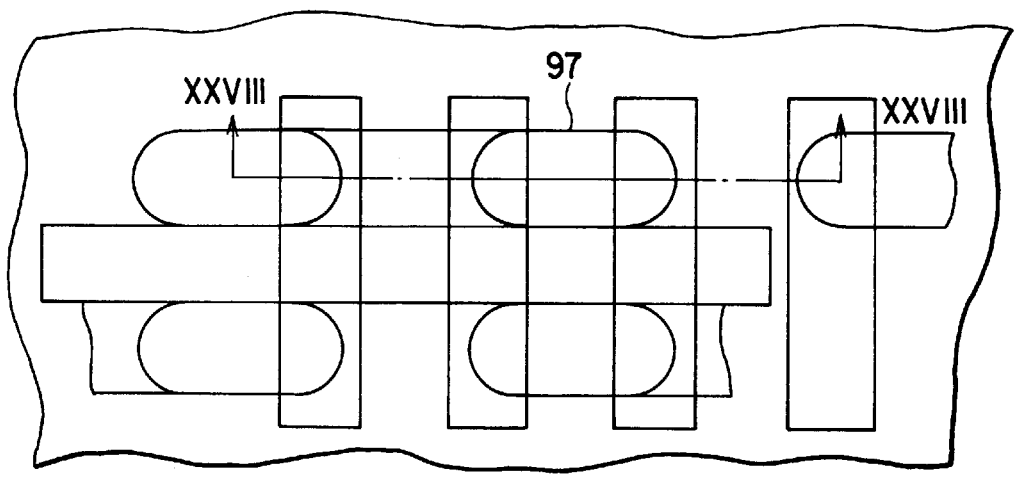
F I G. 27
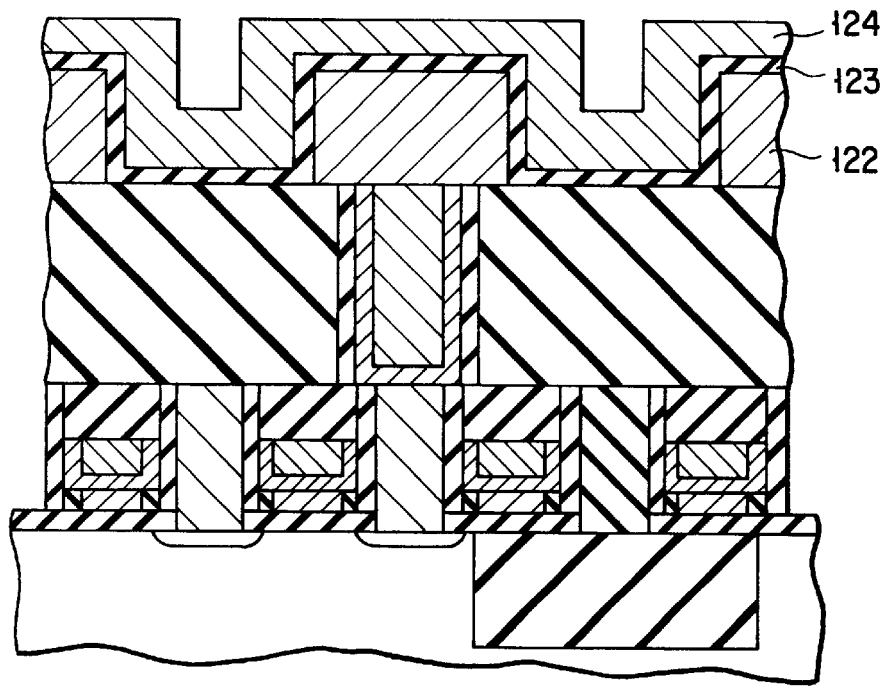
F I G. 28

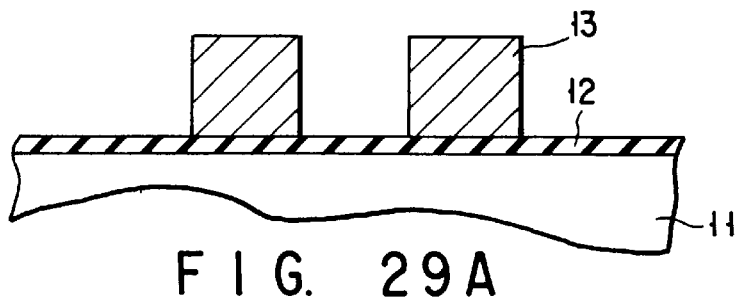
F I G. 29A
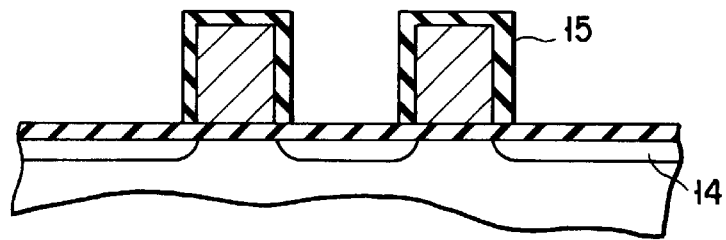
F I G. 29B
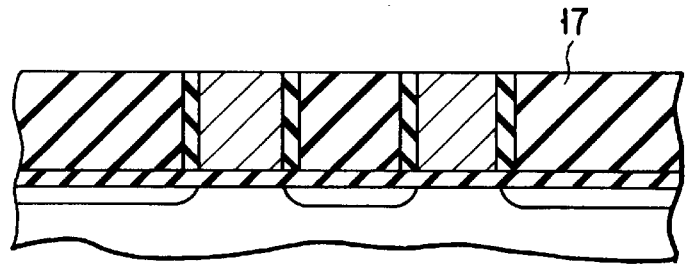
F I G. 29C
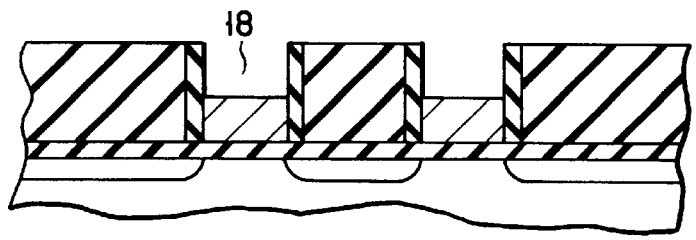
F I G. 29D
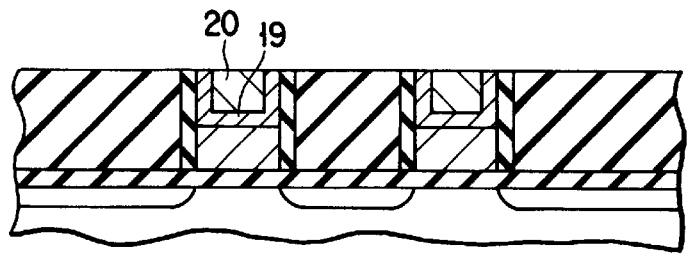
F I G. 29E

SEMICONDUCTOR DEVICE USING DAMASCENE TECHNIQUE AND MANUFACTURING METHOD THEREFOR

BACKGROUND OF THE INVENTION

The present invention relates to a semiconductor device and a manufacturing method therefor, and more particularly to structures of a gate electrode and a bit contact of a highly integrated DRAM and a manufacturing method therefor.

A conventional method of manufacturing a MOS transistor having a conventional metal gate electrode will now be described with reference to FIG. 1.

As shown in FIG. 1A, a gate insulation film 212 is formed on a P-type silicon semiconductor substrate 211, and then a polysilicon film 213, a barrier metal 214 for preventing reactions between polysilicon and a tungsten film and a tungsten film 215 are deposited. Then, a known lithography method and RIE (Reactive Ion Etching) method are employed to pattern gate electrodes. Then, gate electrodes are used as mask for ion implantation for implanting N-type impurities so that a source/drain diffusion regions 216 are formed in the semiconductor substrate 211.

Then, a silicon nitride film 217 is deposited on the overall surface, as shown in FIG. 1B. Then, etching back is performed by the RIE method so that side wall spacers of the silicon nitride film 217 are formed on the side walls of the gate electrodes.

The above-mentioned conventional manufacturing method cannot form a contact hole of a type which approaches gate electrodes in a self alignment manner. That is, the contact hole can be formed when an insulation film 218 is formed on the overall surface, and then a contact hole 219 is formed in the insulation film 218 by using a mask (not shown), as shown in FIG. 1C. What is worse, the tungsten film is exposed to a portion of the gate electrode after the gate electrodes have been formed (see FIG. 1B). As a result, there arises a problem in that the side walls of the gates cannot be oxidized and thus RIE damages or ion implantation damages cannot be restored. When the silicon nitride films 217 serving as the side wall spacers have been formed, the quality of the silicon nitride films deposited on the metal deteriorates as compared with the silicon nitride film deposited on the insulation film or polysilicon. Therefore, there arises a problem in that side walls having a satisfactory quality cannot be formed.

BRIEF SUMMARY OF THE INVENTION

Accordingly, an object of the present invention is to provide a semiconductor apparatus capable of forming a contact hole adjacent to a gate electrode in a self alignment manner and a manufacturing method therefor.

According to one aspect of the present invention, there is provided a method of manufacturing a semiconductor device comprising a step of forming a gate insulation film on a semiconductor substrate; a step of forming, on the gate insulation film, a gate electrode formed by a first conductive film; a step of forming, on the semiconductor substrate, source/drain diffusion layers; a step of forming, on a side wall of the gate electrode, a spacer formed by a first insulation film; a step of forming a second insulation film on the overall surface and etching back the second insulation film to the same height as that of the gate electrode so that the surface is flattened; a step of etching the gate electrode in the direction of the depth thereof to have a predetermined thickness so as to form a first stepped portion from the first insulation film; a step of filling up the first stepped portion by a second conductive film; a step of etching the second conductive film in the direction of the depth thereof to have a predetermined thickness so as to form a second stepped portion from the first insulation film; and a step of filling up the second stepped portion by a third insulation film.

According to another aspect of the present invention, there is provided a method of manufacturing a semiconductor device comprising a step of forming a gate insulation film on a semiconductor substrate; a step of forming, on the gate insulation film, a gate electrode formed by a first conductive film; a step of forming, on the semiconductor substrate, source/drain diffusion layers; a step of forming, on a side wall of the gate electrode, a spacer formed by a first insulation film; a step of forming a second insulation film on the overall surface and etching back the second insulation film to the same height as that of the gate electrode so that the surface is flattened; a step of etching the gate electrode in the direction of the depth thereof to have a predetermined thickness so as to form a first stepped portion from the first insulation film; a step of filling up the first stepped portion by a second conductive film; a step of etching the second conductive film in the direction of the depth thereof to have a predetermined thickness so as to form a second stepped portion from the first insulation film; a step of filling up the second stepped portion by a third insulation film; and a step of etching the second insulation film by a selective etching method using the third insulation film as a mask so as to form a contact hole adjacent to the gate electrode.

According to another aspect of the present invention, there is provided a method of manufacturing a semiconductor device comprising a step of forming a gate insulation film on a semiconductor substrate; a step of forming a first conductive film on the gate insulation film; a step of forming a dummy film on the first conductive film; a step of patterning the dummy film and the first conductive film to form a gate electrode; a step of forming, on the semiconductor substrate, source/drain diffusion layers; a step of forming, on the side wall of the dummy film and the first conductive film, a spacer formed by the first insulation film; a step of forming a second insulation film on the overall surface and etching back the second insulation film to the same height as that of the gate electrode so that the surface is flattened; a step of etching the dummy film to form a first stepped portion from the first insulation film; a step of filling up the first stepped portion by the second conductive film; a step of etching the second conductive film in a direction of the depth thereof to have a predetermined thickness so as to form a second stepped portion from the first insulation film; and a step of filling up the second stepped portion by a third insulation film.

According to another aspect of the present invention, there is provided a method of manufacturing a semiconductor device comprising a step of forming a gate insulation film on a semiconductor substrate; a step of forming a first conductive film on the gate insulation film; a step of forming a dummy film on the first conductive film; a step of patterning the dummy film and the first conductive film to form a gate electrode; a step of forming, on the semiconductor substrate, source/drain diffusion layers; a step of forming, on a side wall of the dummy film and the first conductive film, a spacer formed by the first insulation film; a step of forming a second insulation film on the overall surface and etching back the second insulation film to the same height as that of the gate electrode so that the surface is flattened; a step of etching the dummy film to form a first stepped portion from the first insulation film; a step of filling up the first stepped portion by the second conductive film; a step of etching the second conductive film in a direction of the depth thereof to have a predetermined thickness so as to form a second stepped portion from the first insulation film; a step of filling up the second stepped portion by a third insulation film; and a step of etching the second insulation film by a selective etching method using the third insulation film as a mask so that a contact hole adjacent to the gate electrode is formed.

According to another aspect of the present invention, there is provided a method of manufacturing a semiconductor device comprising a step of forming a gate insulation film on a semiconductor substrate; a step of forming, on the gate insulation film, a gate electrode formed by a first conductive film; a step of forming, on the semiconductor substrate, source/drain diffusion layers; a step of forming, on the side wall of the gate electrode, a spacer formed by a first insulation film; a step of forming a second insulation film on the overall surface and etching back the second insulation film to the same height as that of the gate electrode so that the surface is flattened; a step of etching the gate electrode in the direction of the depth thereof to have a predetermined thickness so as to form a first stepped portion from the first insulation film; a step of filling up the first stepped portion by a second conductive film; a step of etching the second conductive film in the direction of the depth thereof to have a predetermined thickness so as to form a second stepped portion from the first insulation film; a step of filling up the second stepped portion by a third insulation film; a step of etching the second insulation film by a selection etching method using the third insulation film as a mask to form a contact hole adjacent to the gate electrode; and a step of filling up the inside portion of the contact hole to form a bit line and a storage node contact.

According to another aspect of the present invention, there is provided a semiconductor device comprising a semiconductor substrate; a gate insulation film formed on the semiconductor substrate; a gate electrode formed on the gate insulation film and composed of a lower electrode formed by a first conductive film containing silicon and an upper electrode formed by a second conductive film composed of metal; a self-aligned contact formed adjacent to the gate electrode; a second insulation film formed by a first insulation film and silicon nitride formed by the lower electrode of the gate electrode and the self-aligned contact; and a third insulation film formed between the upper electrode and the self-aligned contact and made of silicon nitride.

According to another aspect of the present invention, there is provided a semiconductor device comprising a semiconductor substrate; a gate insulation film formed on the semiconductor substrate; a gate electrode formed on the gate insulation film and composed of a lower electrode formed by a first conductive film containing silicon and an upper electrode formed by a second conductive film made of metal; a self-aligned contact formed adjacent to the gate electrode; a second insulation film composed of a first insulation film and silicon nitride, the first insulation film being composed of silicon oxide formed between the lower electrode of the gate electrode and the self-aligned contact; and a third insulation film formed by silicon nitride formed between the upper electrode and the self-aligned contact and a fourth insulation film made of silicon nitride.

According to another aspect of the present invention, there is provided a semiconductor device comprising a semiconductor substrate; a gate insulation film formed on the semiconductor substrate; a gate electrode formed on the gate insulation film and composed of a lower electrode formed by a first conductive film containing silicon and an upper electrode formed by a second conductive film made of metal; a self-aligned contact formed adjacent to the gate electrode; a first insulation film formed between the lower electrode of the gate electrode and the self-aligned contact and made of silicon oxide, a second insulation film made of silicon nitride and a third insulation film made of silicon nitride; and a fourth insulation film formed between the upper electrode and the self-aligned contact and made of silicon nitride.

According to another aspect of the present invention, there is provided a dynamic semiconductor memory device comprising a memory cell portion, wherein the memory cell portion includes a semiconductor apparatus having a semiconductor substrate; a gate insulation film formed on the semiconductor substrate; a gate electrode formed on the gate insulation film and composed of a lower electrode formed by a first conductive film containing silicon and an upper electrode formed by a second conductive film made of metal; a self-aligned contact formed adjacent to the gate electrode; a first insulation film formed between the lower electrode of the gate electrode and the self-aligned contact and made of silicon oxide and a second insulation film made of silicon nitride; and a third insulation film formed between the upper electrode and the self-aligned contact and made of silicon nitride.

According to another aspect of the present invention, there is provided a dynamic semiconductor memory device comprising a memory cell portion, wherein the memory cell portion includes a semiconductor device having a semiconductor substrate; a gate insulation film formed on the semiconductor substrate; a gate electrode formed on the gate insulation film and composed of a lower electrode formed by a first conductive film containing silicon and an upper electrode formed by a second conductive film made of metal; a self-aligned contact formed adjacent to the gate electrode; a first insulation film formed between the lower electrode of the gate electrode and the self-aligned contact and made of silicon oxide and a second insulation film made of silicon nitride; and a third insulation film formed between the upper electrode and the self-aligned contact and made of silicon nitride and a fourth insulation film made of silicon nitride.

According to another aspect of the present invention, there is provided a dynamic semiconductor memory device comprising a memory cell portion, wherein the memory cell portion includes a semiconductor device having a semiconductor substrate; a gate insulation film formed on the semiconductor substrate; a gate electrode formed on the gate insulation film and composed of a lower electrode formed by a first conductive film containing silicon and an upper electrode formed by a second conductive film made of metal; a self-aligned contact formed adjacent to the gate electrode; a first insulation film formed between the lower electrode of the gate electrode and the self-aligned contact and made of silicon oxide, a second insulation film made of silicon nitride and a third insulation film made of silicon nitride; and a fourth insulation film formed between the upper electrode and the self-aligned contact and made of silicon nitride.

According to another aspect of the present invention, there is provided a semiconductor device comprising first and second transistors each having a gate insulation film formed on a semiconductor substrate and a gate electrode formed on the gate insulation film and composed of a lower electrode formed by a first conductive film containing silicon and an upper electrode formed by a second conductive film made of metal, wherein the thickness of the upper electrode of the second transistor is larger than the thickness of the upper electrode of the first transistor.

According to another aspect of the present invention, there is provided a dynamic semiconductor memory device comprising a memory cell portion including a first transistor having a gate insulation film formed on a semiconductor substrate and a gate electrode formed on the gate insulation film and composed of a lower electrode formed by a first conductive film containing silicon and an upper electrode formed by a second conductive film made of metal; and a peripheral circuit including a second transistor having a gate insulation film formed on a semiconductor substrate and a gate electrode formed on the gate insulation film and composed of a lower electrode made of a first conductive film containing silicon and a lower electrode formed by a second conductive film made of metal, wherein the thickness of the upper electrode are larger than the thickness of the upper electrode of the first transistor.

According to another aspect of the present invention, there is provided a dynamic semiconductor memory device comprising a device isolation insulation film formed on a semiconductor substrate; a MOSFET formed on the semiconductor substrate through a gate insulation film and composed of a gate electrode consisting of a lower electrode formed by a first conductive film containing silicon and an upper electrode formed by a second conductive film made of metal and a source diffusion layer and a drain diffusion layer which are formed on the semiconductor substrate; a first insulation film formed to cover the MOSFET; first and second self-aligned contacts formed on the first insulation film to be formed adjacent to the gate electrode; a first insulation film formed between the lower electrode of the gate electrode and the first and second self-aligned contacts and made of silicon oxide and a second insulation film made of silicon nitride; a third insulation film formed between the upper electrode and the first and second self-aligned contacts and made of silicon nitride; a bit line electrically connected to either the self-aligned contact or the second self-aligned contact; and a capacitor composed of a storage electrode, a capacitor insulation film and a plate electrode and electrically connected to either the first self-aligned contact or the second self-aligned contact which is not electrically connected to the bit line.

According to another aspect of the present invention, there is provided a semiconductor device comprising a semiconductor substrate; a gate insulation film formed on the semiconductor substrate; a gate electrode formed on the gate insulation film and composed of a lower electrode formed by a first conductive film containing silicon and an upper electrode formed by a second conductive film made of metal; and a first insulation film formed on a side wall of the lower electrode and made of silicon oxide, wherein a portion of the upper electrode overlaps an upper portion of the first insulation film.

According to another aspect of the present invention, there is provided a method of manufacturing a semiconductor device comprising a step of forming a gate insulation film on a semiconductor substrate; a step of forming, on the gate insulation film, a gate electrode formed by a first conductive film; a step of forming, on the semiconductor substrate, source/drain diffusion layers; a step of forming a first insulation film and etching back to the same height as that of the gate electrode so that the surface is flattened; a step of etching the gate electrode in a direction of the depth thereof to have a predetermined thickness to form a stepped portion from the first insulation film; and a step of filling up the stepped portion by a second conductive film.

According to another aspect of the present invention, there is provided a semiconductor device comprising a semiconductor substrate; a gate insulation film formed on the semiconductor substrate and a gate electrode formed on the gate insulation film and composed of a lower electrode formed by a first conductive film containing silicon and an upper electrode formed by a second conductive film made of metal; and a first insulation film formed on a side wall of the lower electrode and made of silicon oxide.

According to another aspect of the present invention, there is provided a method of manufacturing a semiconductor device comprising a step of forming, on a semiconductor substrate, first insulation film portions each containing impurities having a conductive type opposite to that of the semiconductor substrate, the first insulation film portions being formed at predetermined intervals; a step of introducing the impurities included in the first insulation film into the semiconductor substrate to form source/drain diffusion layers; a step of depositing a gate insulation film on the overall surface including the upper surface of the semiconductor substrate; a step of filling up portions among the first insulation film portions with first conductive film portions through the gate insulation film; a step of etching the first conductive film filling up the portions in a direction of the depth thereof to have a predetermined thickness so as to form a stepped portion from the first insulation film; a step of filing up the stepped portion by a second insulation film; and a step of removing the gate insulation film formed on the first insulation film and the first insulation film formed below the gate insulation film to form a contact hole leading to the surface of the source/drain diffusion layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a plan view of the pattern of a mask for use in a process for manufacturing a MOSFET according to the sixth embodiment;

FIG. 9 is a circuit diagram showing the structure of a decoder section of a DRAM;

FIG. 10 is a block diagram showing a chip having a DRAM and a logic section consolidated thereon;

FIG. 15 is a cross sectional view showing a process following the process shown in FIG. 14;

FIG. 16 is a plan view showing the pattern of a mask which is used in a process for manufacturing a DRAM cell according to the seventh embodiment of the present invention;

FIG. 17 is a cross sectional view showing an intermediate process for manufacturing the DRAM cell which is formed by using the mask shown in FIG. 16;

FIG. 18 is a plan view showing the pattern of a mask for use in an intermediate process for manufacturing a DRAM cell according to a seventh embodiment of the present invention;

FIG. 19 is a cross sectional view showing a DRAM cell which is formed by using the mask shown in FIG. 18;

FIG. 20 is a cross sectional view showing an intermediate process for forming a DRAM cell by using the mask shown in FIG. 18;

FIG. 27 is a plan view showing the pattern of a mask for use in a process for manufacturing the DRAM cell according to the seventh embodiment of the present invention;

FIG. 28 is a cross sectional view showing a DRAM cell which is formed by a mask shown in FIG. 27;

FIGS. 29A to 29E are cross sectional views showing a process for manufacturing a MOSFET according to an eighth embodiment of the present invention.

DETAILED DESCRIPTION OF THE INVENTION

Figure 1A:
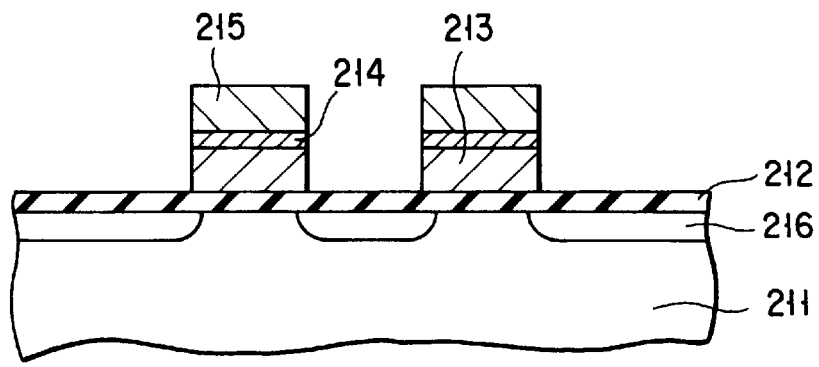
FIGS. 1A to 1C are cross sectional views showing a process for manufacturing a conventional MOS transistor having a metal gate electrode.
Figure 1B:
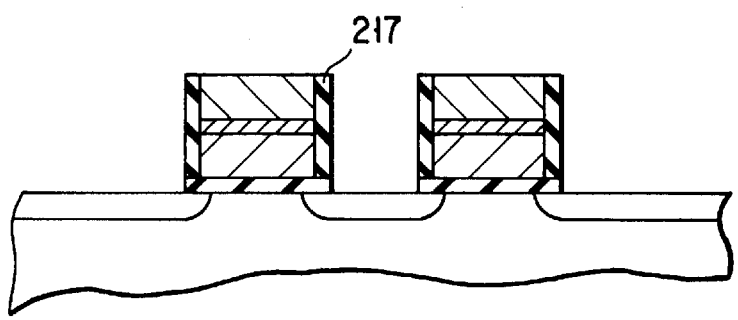
Figure 1C:
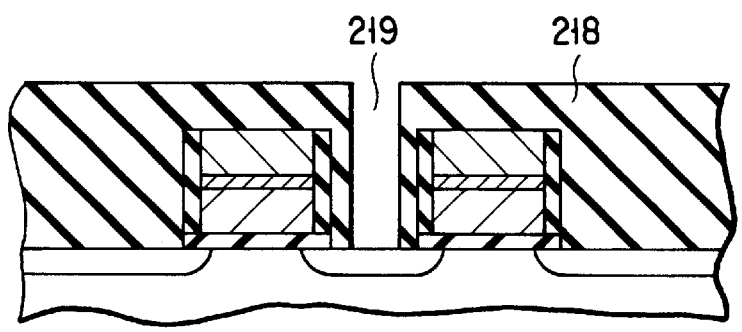

Referring to the drawings, embodiments of the present invention will now be described.

FIGS. 2A to 2J sequentially show processes which are performed when a method of manufacturing a semiconductor device according to the present invention is employed to manufacture a MOSFET.

Figure 2A:
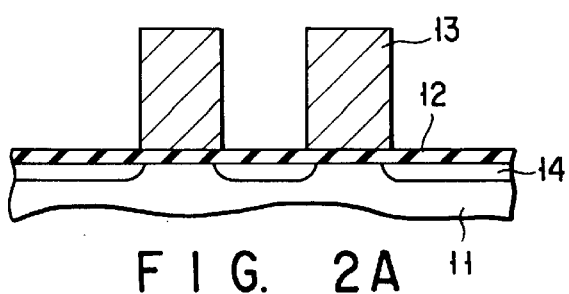
FIGS. 2A to 2J are cross sectional views showing a process for manufacturing a MOSFET according to a first embodiment of the present invention.

As shown in FIG. 2A, a gate insulation film 12 is formed on P-type silicon semiconductor substrate 11, and then polysilicon films 13 into which N-type impurities have been doped is deposited on the overall surface. Then, a known lithography method and RIE (Reactive Ion Etching) method are employed to pattern the gate electrodes. Then, the gate electrodes are used as a mask to implant N-type impurities, such as P, As or the like, by an ion implantation method so that source/drain diffusion layers 14 are formed on the semiconductor substrate 11.

Figure 2F:
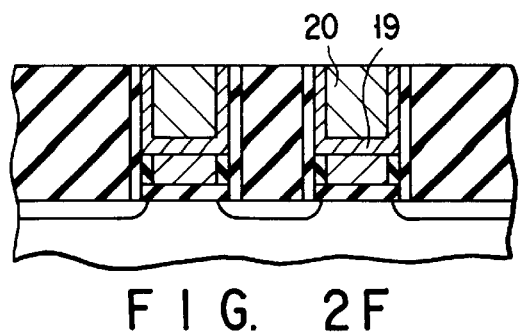
Figure 2B:
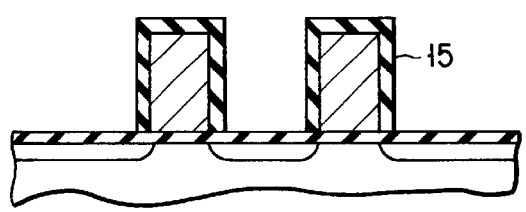

Then, as shown in FIG. 2B, RIE damages or ion implantation damages are restored by performing an oxidizing process so that silicon oxide films 15 are formed on the exposed surface of the gate electrodes.

Figure 2G:
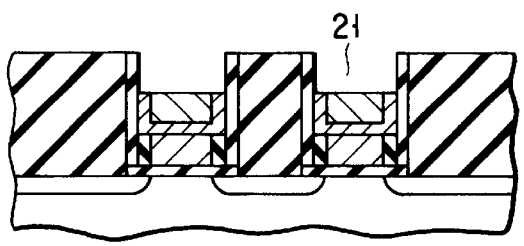
Figure 2C:
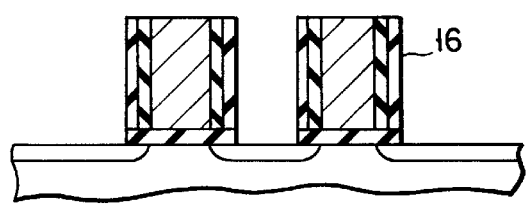

Then, as shown in FIG. 2C, silicon nitride film 16 is deposited on the overall surface, and then etching back is performed by the RIE method so that side wall spacers are formed by silicon nitride films 16 on the side walls of the gate electrodes.

Figure 2H:
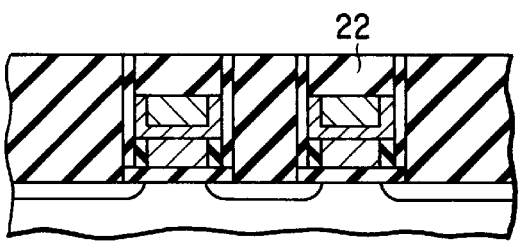
Figure 2D:
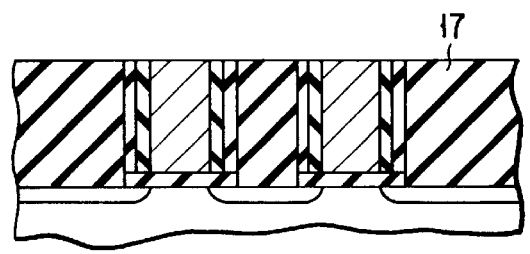

Then, as shown in FIG. 2D, a silicon oxide film 17 is deposited on the overall surface, and then the silicon oxide film 17 is polished by use of CMP (Chemical Mechanical Polishing) method until the gate electrodes are exposed to flatten the surface.

Figure 2I:
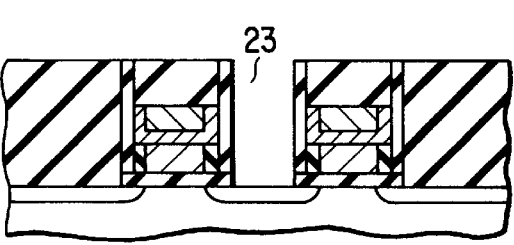
Figure 2E:
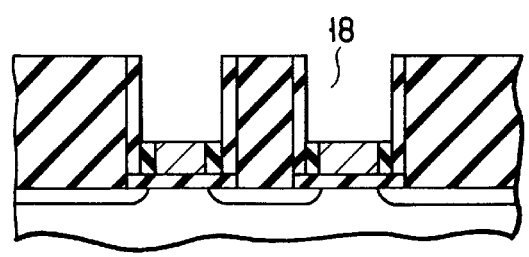

Then, as shown in FIG. 2E, the RIE method is employed to selectively etch the polysilicon films 13 to form stepped portions 18 from the silicon oxide films 17. At this time, the silicon oxide films 15 existing on the side walls of the polysilicon films 13 are etched by dilute HF solution or the like to have a depth similar to that of the polysilicon films 13.

Then, as shown in FIG. 2F, barrier metals 19 made of TiN, WN or the like are deposited on the overall surface by a sputtering method to have a thickness with which the barrier metals 19 do not completely fill up the stepped portions 18. Then, refractory metal film, for example, a tungsten film 20, is deposited on the overall surface by a CVD (Chemical Vapor Deposition) method so that the stepped portions 18 are fully filled up. Then, the CMP method is employed to polish the tungsten film 20 and the barrier metals 19 until the silicon oxide films 17 are exposed so that the surface is flattened.

Then, as shown in FIG. 2G, the RIE method is employed to etch the tungsten films 20 and the barrier metals 19 so that stepped portions 21 from the silicon oxide films 17 are realized.

Then, as shown in FIG. 2H, a silicon nitride film 22 is deposited on the overall surface so as to fill up the stepped portions 21. Then, the CMP method is employed to polish the silicon nitride film 22 until the silicon oxide films 17 are exposed so that the surface is flattened.

Then, as shown in FIG. 2I, a predetermined contact hole pattern is used to etch the silicon oxide film 17 by the RIE method under condition with which a high selection ratio can be realized with respect to the silicon nitride films 22 and 16 so that a contact hole 23 formed adjacent to the gate electrodes is formed.

Figure 2J:
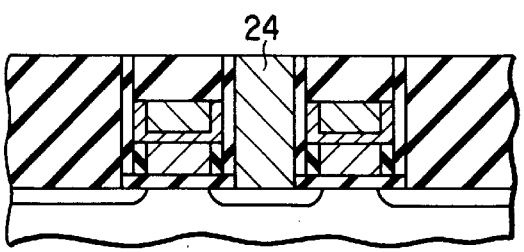

Then, as shown in FIG. 2J, a polysilicon film 24 having N-type impurities doped thereto is deposited to fill the contact hole 23. Then, the CMP method is employed to polish the polysilicon film 24 until the silicon oxide films 17 and the silicon nitride films 22 are exposed to flatten the surface.

As described above, the contact (the polysilicon film 24) adjacent to the gate electrodes in the self aligned manner can be established. Since the gate electrodes are made of the metal material (the tungsten film) as described above, the sheet resistance can be lowered as compared with polysilicon electrodes or the like. Thus, transistors having excellent performance because the gate delay can be restrained can be. manufactured. Since the side walls of the gate electrodes can be oxidized, another effect can be obtained in that RIE damages or ion implantation damages can be restored.

Although the conventional structure has been formed such that the silicon nitride films 16 serving as the side wall spacers are deposited on the metal portion, this embodiment has the structure such that the same is deposited on the silicon oxide film 15 on the polysilicon film 13. Therefore, an excellent side wall spacer can be formed without deterioration in the silicon nitride film 16.

FIGS. 3A to 3J sequentially show the process of a second embodiment of the manufacturing method in which the method of manufacturing a semiconductor device is applied to a method of manufacturing a MOSFET.

Figure 3A:
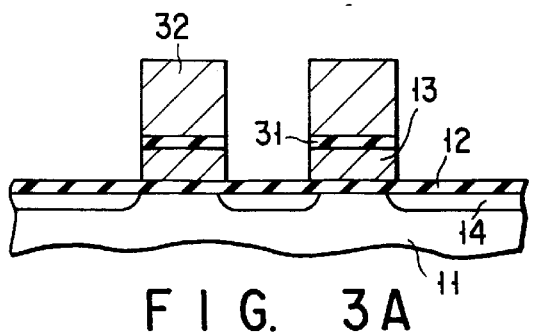
FIGS. 3A to 3J are cross sectional views showing a process for manufacturing a MOSFET according to a second embodiment of the present invention.

As shown in FIG. 3A, a gate insulation film 12 is formed on a P-type silicon semiconductor substrate 11. Then, a polysilicon film 13 having N-type impurities doped thereto is deposited on the overall surface. The surface of the polysilicon film 13 is oxidized so that a silicon oxide film 31 is formed. Then, a polysilicon film 32 is deposited on the overall surface. The polysilicon film 32, which is the upper layer, is used as a dummy films. Then, the known lithography method and the RIE method are used to pattern the gate electrodes. Then, the gate electrodes are used as a mask when N-type impurities, such as P, As or the like, are implanted by an ion implantation method so that source/drain diffusion layers 14 are formed.

Figure 3F:
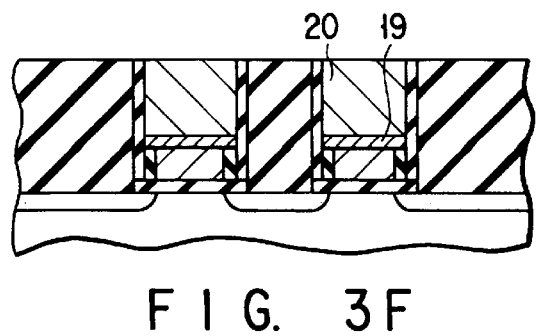
Figure 3B:
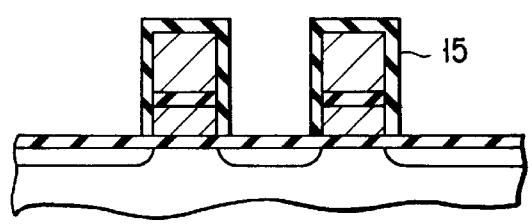
Figure 3G:
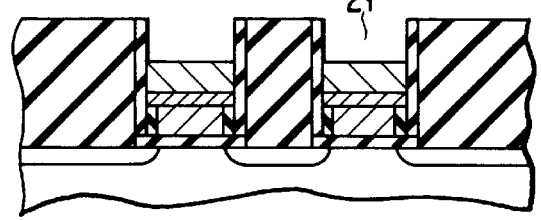

Then, as shown in FIG. 3B, RIE damages or ion implantation damages are restored by performing an oxidizing process so that silicon oxide films 15 are formed on the exposed surface of the gate electrodes.

Figure 3C:
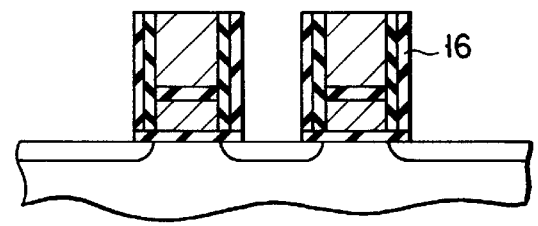
Figure 3H:
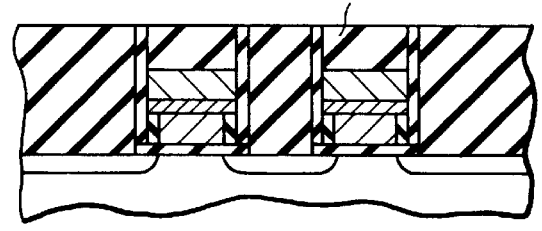

Then, as shown in FIG. 3C, a silicon nitride film 16 is deposited on the overall surface, and then etching back is performed by the RIE method so that side wall spacers are formed by the silicon nitride films 16 on the side walls of the gate electrodes.

Figure 3D:
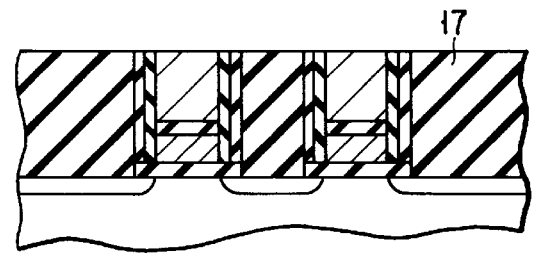
Figure 3I:
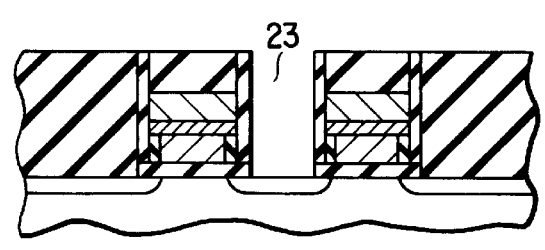

Then, as shown in FIG. 3D, a silicon oxide film 17 is deposited on the overall surface, and then the silicon oxide film 17 is polished by the CMP method until the gate electrodes are exposed to flatten the surface.

Figure 3E:
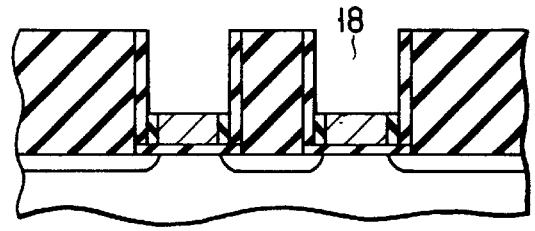
Figure 3J:
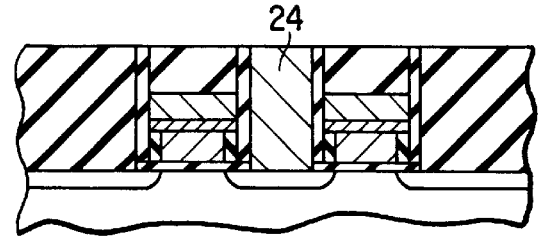

Then, as shown in FIG. 3E the RIE method or a CDE (Chemical Dry Etching) method, which is isotropic etching, is employed to remove the polysilicon films 32 by etching. Then, the silicon oxide films 31 and 15 are etched so that stepped portions 18 from the silicon oxide film 17 are formed. At this time, the thickness of the polysilicon films 13 formed into a portion (a lower electrode) of the gate electrodes are controlled by changing the amount of etching performed by the RIE method in the first embodiment. In this embodiment, the thicknesses of the polysilicon films 13 are controlled by changing the thickness of deposition of the polysilicon film 13 so that satisfactory controllability is realized.

Then, as shown in FIG. 3F, Ti film is deposited by using a sputtering method to have a thickness with which the stepped portions 18 are not fully filled up. Then, heat treatment is performed to cause reactions with the polysilicon films 13 to take place so that a $TiSi_2$ film is formed. Then, non-reacted Ti is removed so that layers (a barrier metal 19) for preventing reactions between the polysilicon film and the tungsten film are selectively formed on the polysilicon films 13. Then, a tungsten film 20 is deposited on the overall surface to fully fill up the stepped portions 18. Then, the CMP method is employed to polish the tungsten films 20 and the barrier metals 19 until the silicon oxide films 17 are exposed so that the surface is flattened. As a matter of course, a method similar to that according to the first embodiment may be employed in which the barrier metal and the tungsten are continuously deposited.

Since the following processes (see FIGS. 3G to 3J) are similar to those according to the first embodiment, the similar processes are omitted from description.

Also the method according to this embodiment enables a contact which approaches the gate electrodes in the self alignment manner to be formed. Since gate electrodes are made of the metal material as described above, the sheet resistance can be lowered as compared with polysilicon electrodes or the like. Thus, transistors having excellent performance because the gate delay can be restrained can be manufactured. Since the side walls of the gate electrodes can be oxidized, another effect can be obtained in that RIE damages or ion implantation damages can be restored.

Since the silicon nitride films 16, which is the side wall spacers, are deposited on the silicon oxide films 15 on the polysilicon films 13, excellent side wall spacers can be formed without deterioration in the silicon nitride films 16.

Figure 4A:
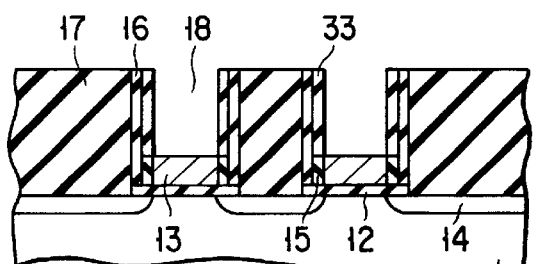
FIGS. 4A and 4B are cross sectional views showing a process for manufacturing a MOSFET according to a third embodiment of the present invention.
Figure 4B:
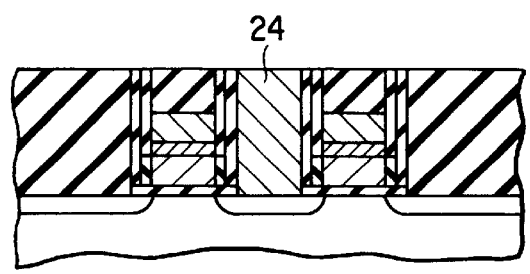

FIGS. 4A and 4B show a portion of the process according to a third embodiment of the present invention.

Also the method according to the third embodiment has a structure in which the method according to the present invention is applied to a method of manufacturing a MOSFET. Since the process in FIGS. 3A to 3E are similar to that according to the second embodiment, the similar process is omitted from description. After the stepped portions 18 have been formed in the process shown in FIG. 3E, the silicon nitride film 33 is deposited on the overall surface, as shown in FIG. 4A. Then, etching back is performed by the RIE method so that side wall spacers in the form of the silicon nitride films 33 are formed on the inner walls of the stepped portions 18.

Then, a method similar to that according to the second embodiment is performed so that transistors having a metal gate electrode having a self alignment contact (the polysilicon film 24) as shown in FIG. 4B are manufactured.

The method according to the third embodiment enables an effect obtainable from the second embodiment to be obtained. Since the silicon nitride films 16 and 33 exist between the tungsten film 20, which is the upper electrode of the gate electrodes, and the self-aligned contact (the polysilicon film 24), another effect can be obtained in that the possibility of short circuits between the gate electrodes and the polysilicon films 24 can significantly be lowered.

FIGS. 5A to 5G show a fourth embodiment of the present invention in which the method of manufacturing a semiconductor device according to the present invention is employed to manufacture a MOSFET.

Figure 5A:
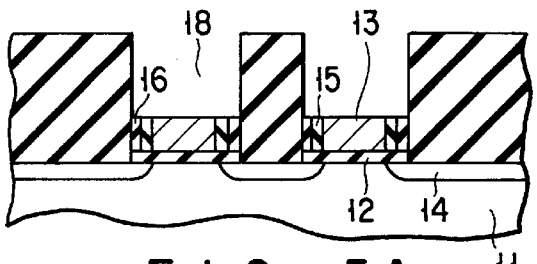
FIGS. 5A to 5G are cross sectional views showing a process for manufacturing a MOSFET according to a fourth embodiment of the present invention.

Since the process shown in FIGS. 3A to 3E are similar to that according to the second embodiment, the similar process is omitted from description. After the stepped portions 18 have been formed in the process shown in FIG. 3E, the silicon nitride films 16 are etched by using hot phosphoric acid solution or the like to have a depth similar to that of the polysilicon films 13, as shown in FIG. 5A.

Figure 5E:
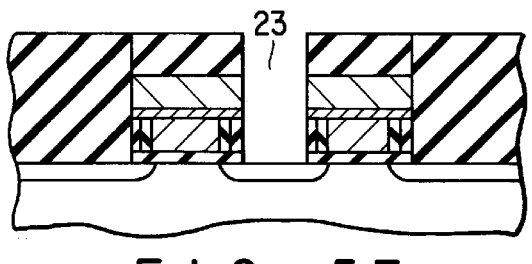
Figure 5B:
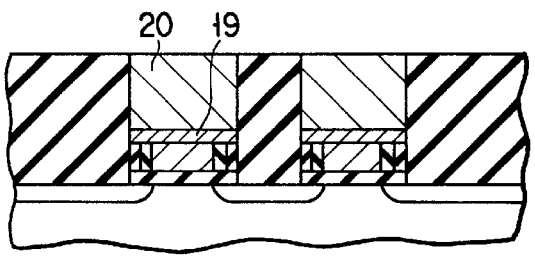

Then, as shown in FIG. 5B, the barrier metals 19 are deposited by the sputtering method to have a thickness with which the stepped portions 18 are not fully filled up. Then, the tungsten film 20 is deposited on the overall surface to fully fill up the stepped portions 18. Then, the CMP method is employed to polish the tungsten film 20 and the barrier metals 19 until the silicon oxide films 17 are exposed so that the surface is flattened.

Figure 5F:
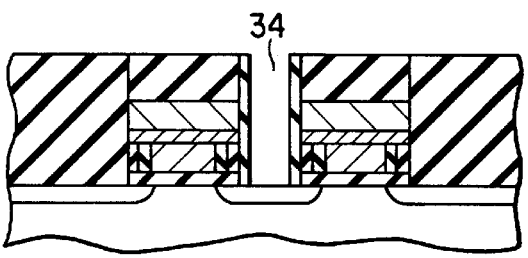
Figure 5C:
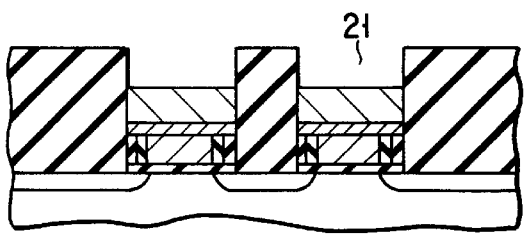

Then, as shown in FIG. 5C, the RIE method is employed to etch the tungsten films 20 to an intermediate depth so that the stepped portions 21 are formed.

Figure 5G:
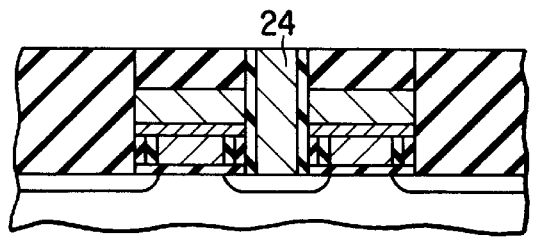
Figure 5D:
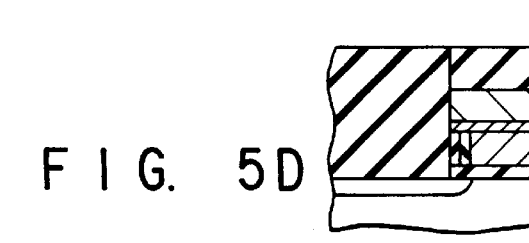

Then, as shown in FIG. 5D, the silicon nitride film 22 is deposited on the overall surface so that the stepped portions 21 are filled up. Then, the CMP method is employed to polish the silicon nitride film 22 until the silicon oxide films 17 are exposed so that the surface is flattened.

Then, as shown in FIG. 5E, a predetermined contact hole pattern is used to etch the silicon oxide films 17 by the RIE method under a condition with which a high selection ratio can be realized with respect to the silicon nitride films 22 so that a contact hole 23 adjacent to the gate electrodes are formed.

Then, as shown in FIG. 5F, a silicon nitride film 34 is deposited on the overall surface, and then etching back is performed by the RIE method so that side wall spacers in the form of the silicon nitride film 34 are formed on the inner wall of the contact hole 23.

Then, as shown in FIG. 5G, the polysilicon film 24 having N-type impurities doped thereto is deposited to fill up the contact hole 23. Then, the CMP method is employed to polish the polysilicon film 24 until the silicon oxide films 17 and the silicon nitride films 22 are exposed so that the surface is flattened.

Also the method according to this embodiment enables an effect similar to that obtainable from the second embodiment output to be obtained. Since the tungsten films 20 to be formed into a portion of the gate electrodes are formed right above the silicon nitride films 16, the width of the gate can be enlarged while maintaining a required length of the channel. Therefore, the sheet resistance of the gate electrodes can furthermore be lowered so that transistors having excellent performance because the gate delay can be restrained are manufactured.

Figure 6A:
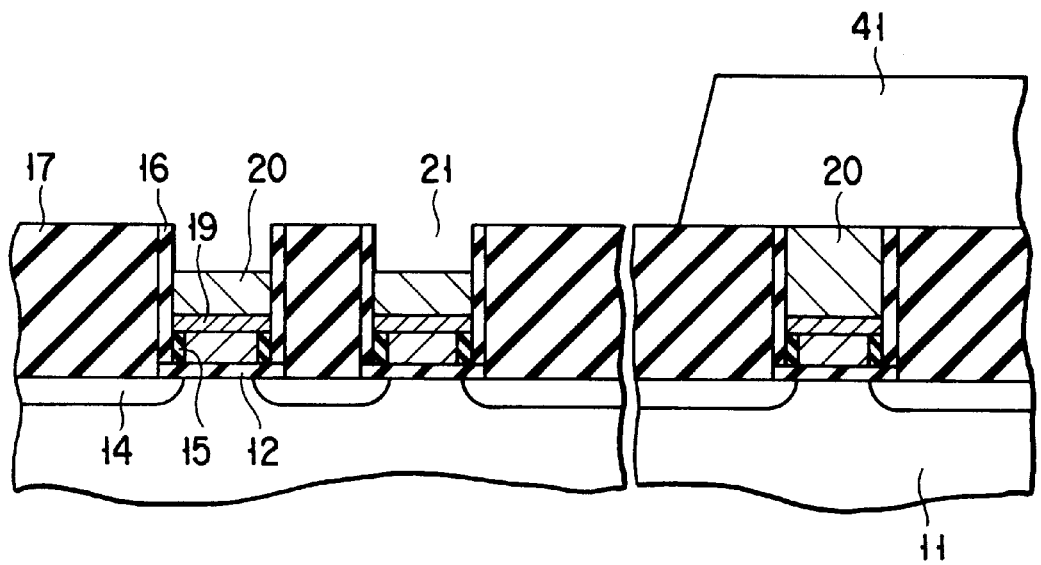
FIGS. 6A and 6B are cross sectional views showing a process for manufacturing a MOSFET according to a fifth embodiment of the present invention.
Figure 6B:
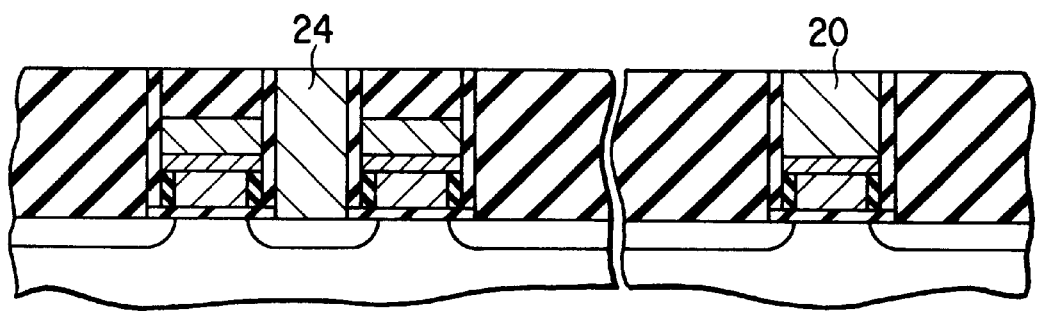

FIGS. 6A and 6B show a process of a fifth embodiment of the present invention in which the method of manufacturing a semiconductor device according to the present invention is employed to manufacture a MOSFET.

Since the process shown in FIGS. 3A to 3F is similar to that according to the second embodiment, the similar process is omitted from description. After the process shown in FIG. 3F has been performed, the known lithography method is employed to form a resist 41 having a pattern covering a region in which no self aligned contact exists as shown in FIG. 6A. When a DRAM is manufactured, the regions each having the self aligned contact correspond to memory cell portions. On the other hand, regions in which no self aligned contact exists correspond to peripheral circuit portions. Then, the resist 41 is used as a mask to etch the tungsten films 20 to an intermediate depth by the RIE method so that the stepped portions 21 are formed in only the memory cell portion.

Then, a method similar to that according to the second embodiment is employed so that transistors provided with metal gate electrodes having a self aligned contact in the memory cell portion thereof are manufactured.

Also the method according to this embodiment enables an effect similar to that obtainable from the second embodiment to be obtained. Since the tungsten films 20 to be formed into a portion of the gate electrodes have a large thickness in the peripheral circuit portion, the sheet resistance of the gate electrodes can furthermore be lowered so that transistors having excellent performance because the gate delay can be restrained is manufactured.

A sixth embodiment of the present invention will now be described. The sixth embodiment has a structure such that the present invention is applied to a highly integrated DRAM. The highly integrated DRAM is exemplified by a BEST (BuriED STrap) cell disclosed in "L. Nesbit et al., "A 0.6 $\mu$m 256 Mb Trench DRAM Cell With Self-Aligned Buried Strap", 1993 TEDM Technical Digest, pp. 627–630" and "G. Bronner et al., "A fully Planarized 0.25 $\mu$m CMOS Technology Digest of Technical Papers, pp. 15–16, 1995".

Figure 7A:
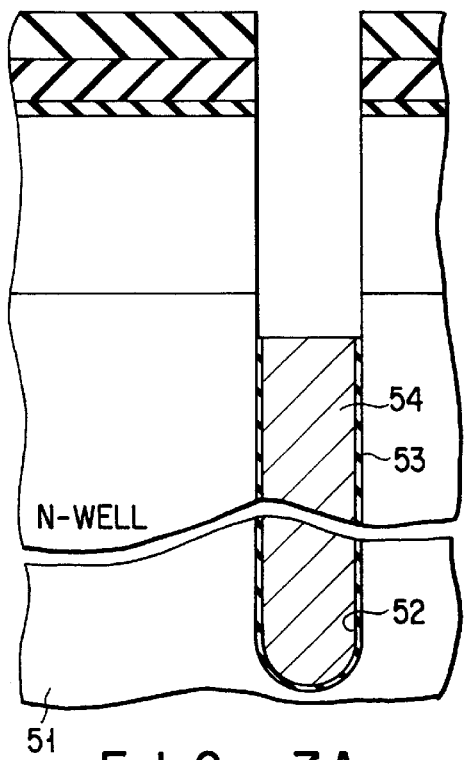
FIGS. 7A to 7G are cross sectional views showing a process for manufacturing a MOSFET according to a sixth embodiment of the present invention.

As shown in FIG. 7A, a buried N-type well (N-well) 51 is formed in the semiconductor substrate, and then the known lithography method and the RIE method are employed to form a trench 52 which reaches the semiconductor substrate. Then, N-type impurities, for example, As, are diffused from the trench 52 to the substrate so that an N+diffusion layer (not shown) is formed. Then, an ON film 53 is formed on the inner wall of the trench 52, and then a polysilicon film 54 is used to fill the trench 52. Then, the polysilicon film 54 is etched back to an intermediate portion of the trench 52.

Figure 7B:
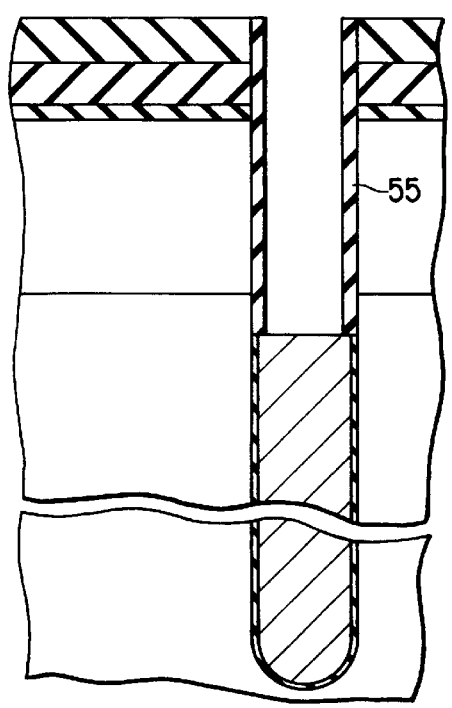

Then, as shown in FIG. 7B, an oxide collar 55 is formed along the inner wall of the trench 52.

Figure 7C:
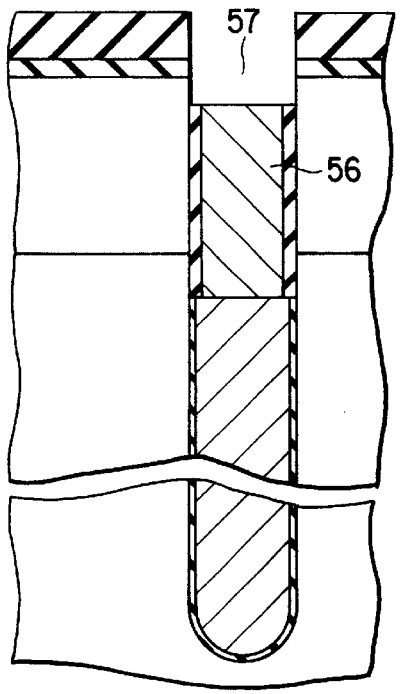

Then, as shown in FIG. 7C, the trench 52 is again filled with a polysilicon film 56, and then the polysilicon film 56 is etched back so that a portion of the upper portion of the oxide collar 55 is exposed. Then, the exposed oxide collar 55 is etched so that a side wall contact hole 57 is formed.

Figure 7D:
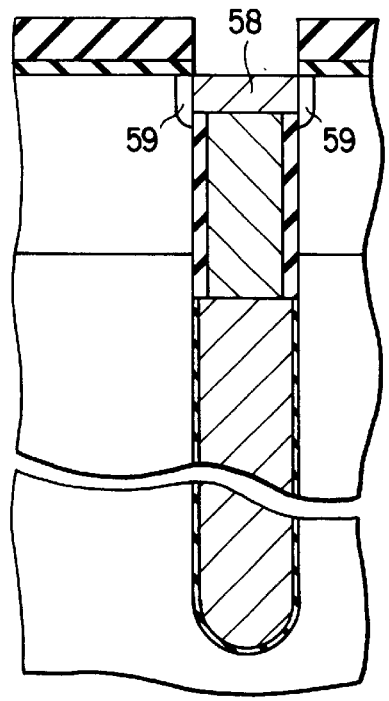

Then, as shown in FIG. 7D, a polysilicon film 58 is buried, and then etching back is performed to the surface, followed by performing heat treatment. Thus, a buried strap 59 is formed.

Figure 7E:
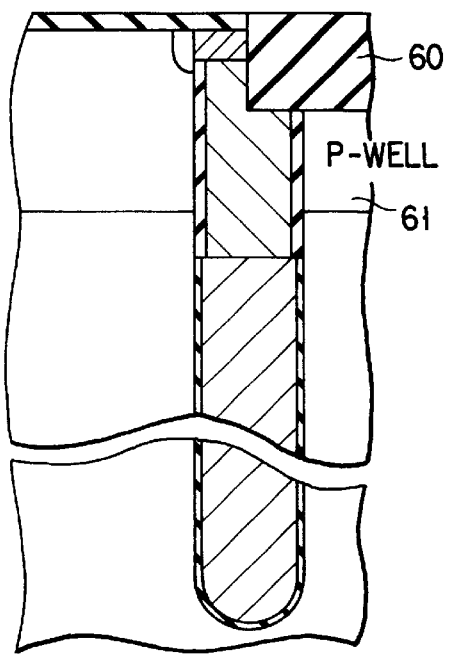

Then, as shown in FIG. 7E, an STI (Shallow Trench Isolation) 60 is formed at a predetermined position, and then ion implantation is performed so that a P-type well (P-well) 61 is formed.

Figure 7F:
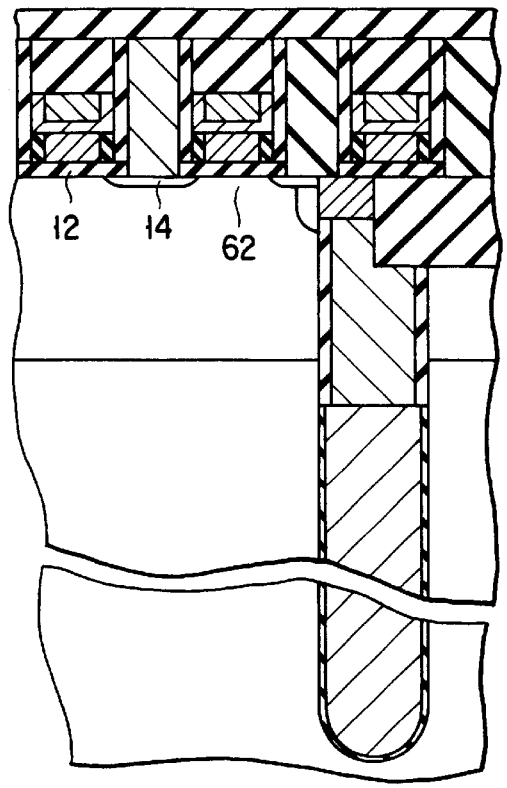

Then, a method similar to that according to the second embodiment is employed so that a MOSFET 62 composed of the gate insulation film 12, the gate electrodes, the source/drain diffusion layers 14 and the side wall spacer are formed, as shown in FIG. 7F.

Figure 7G:
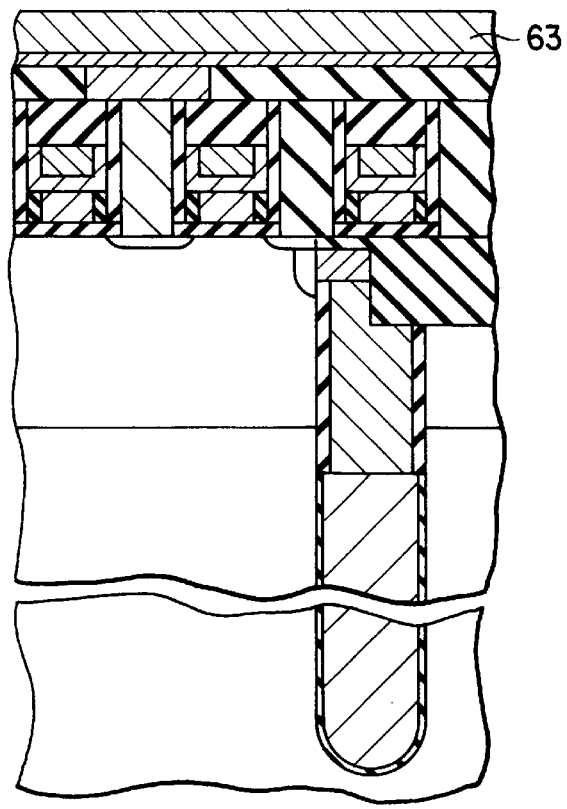

Then, as shown in FIGS. 7G and 8, a bit line 63 is formed in the self alignment manner with respect to the gate electrodes. Then, a known method is employed to form a wiring layer so that the DRAM is manufactured.

The above-mentioned method is able to form, on the P-type well formed on the semiconductor substrate, the MOSFET 62 composed of the gate electrodes, the source/drain diffusion layers and the side wall spacer in which the gate oxide film, the polysilicon film, barrier metal, tungsten film and the silicon nitride films are laminated. The trench 52 is formed adjacent to the MOSFET 62. A capacitor is formed in the lower portion of the trench 52, the capacitor being composed of the buried N-type well 51, the ON film 53 and the polysilicon film 54. Moreover, the oxide collar 55 is formed in the intermediate portion of the trench 52 along the inner wall of the trench 52. In addition, the polysilicon film 56 is formed in the trench 52. One of the source/drain diffusion layers of the MOSFET is connected to the buried strap 59 and connected to the polysilicon film 58 through the side wall contact hole 57 formed in the upper portion of the trench 52. The polysilicon films 54, 56 and 58 are connected to one another so as to fill the trench 52. The STI 60 which is the device isolation region is formed in the upper portion of the trench 52 to be opposite to the buried strap 59. On the substrate, there is formed the bit line 63 electrically connected to the source/drain diffusion layer.

The degree of integration of the DRAM has been raised at a rate of four times per three years. In recent years, memory cells have been precisely formed by degrees superior to the progress of the lithography technology. As a result, a variety of self alignment techniques have been developed which are capable of suspending the limitations of the lithography technique. In particular, a technique for forming the bit line contact in a self alignment manner with respect to the gate electrodes has been considered to be an essential technique for manufacturing a 64 Mb-DRAM and DRAMs having larger capacities.

On the other hand, metal wires have been made difficult because the structure has been made precise significantly. Accordingly, an attempt has attracted attention in which the structure of the decoder is contrived to enlarge the pitches from the metal wires as disclosed in, for example, "K. Noda et al., "A Boosted Dual Word-line Decoding Scheme for 256 Mb DRAMs "1992 Symposium on VLSI Circuits Digest of Technical Papers, pp. 112–113, 1992".

FIG. 9 shows the structure of a decoder section of the DRAM disclosed in the above-mentioned document. A row decoder 71 outputs signals for driving complementary main word lines MWL0 and /MWL0. On the other hand, two N-channel MOSFETs 73 and 74 are, in series, connected between a node, to which a boosted output is supplied from a word line drive decoder 72, and the ground. A signal output from either the main word line MWL0 or the main word line /MWL0 is, through an N-channel MOSFET 75 having a gate connected to the node for receiving the boosted voltage, supplied to the gate of the N-channel MOSFET 73. A signal output from the other one of the main word lines MWL0 or /MWL0 is supplied to the gate of the N-channel MOSFET 74. A signal supplied from the series connection between the two N-channel MOSFETs 73 and 74 is supplied to a sub-word line SWL.

In the above-mentioned structure, the sheet resistance of the gate electrodes of the memory cell which is the sub-word line SWL raises a problem. Therefore, a material for forming the electrodes of a type having lower sheet resistance has been required. Accordingly, the above-mentioned transistor comprising the gate electrodes made of metal is employed as the memory cell of the DRAM shown in FIG. 9 so that the sheet resistance of the gate electrodes are satisfactorily lowered.

Moreover, a technique is known in which the DRAM and the logic are integated on one chip as disclosed in, for example, "S. Miyano et al., "A 1.6 Gbyte/s Data Transfer Rate 8 Mb Embedded DRAM "IEEE Journal of Solid-state Circuit, Vol. 30, No. 11, pp. 1281–1285, 1995". FIG. 10 shows the structure of the DRAM disclosed in the above-mentioned document. A chip 81 includes a DRAM section 82 and a logic section 83 formed therein.

In this case, the gate electrodes of the transistor are required to have low resistance in order to maintain the transistor performance of the logic section 83. In view of the foregoing, a structure in which the transistor having the gate made of the above-mentioned metal is employed to form the logic section 83 shown in FIG. 10 enables the transistor performance of the logic section 83 to be maintained satisfactorily.

A seventh embodiment of the present invention will now be described. The seventh embodiment has a structure in which the present invention is applied to a method of manufacturing an STC type DRAM cell.

Figure 11:
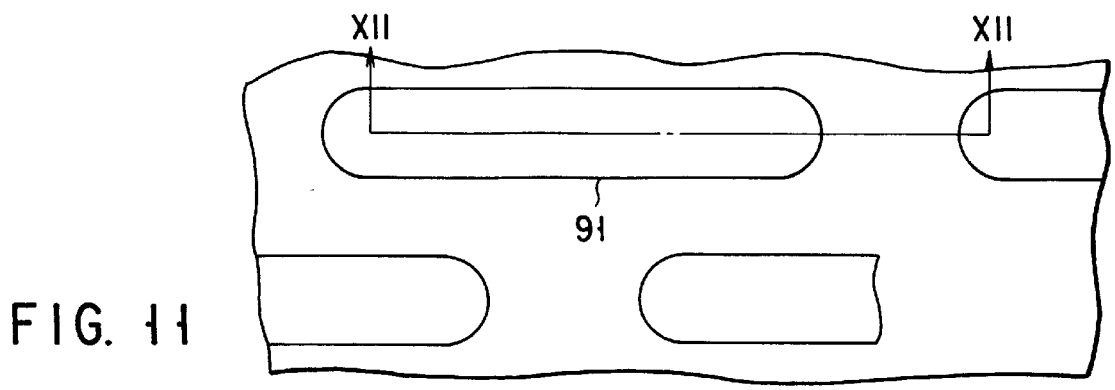
FIG. 11 is a plan view of the pattern of a mask for use in a process for manufacturing a DRAM cell according to a seventh embodiment of the present invention.
Figure 12:
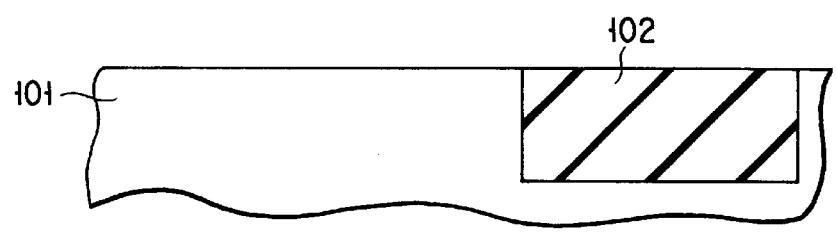
FIG. 12 is a cross sectional view showing a DRAM cell which is manufactured by a mask shown in FIG. 11.

Initially, an active region pattern 91 shown in FIG. 11 is used to form a device isolation oxide film 102 on the surface of a P-type silicon semiconductor substrate 101 by the known STI (Shallow Trench Isolation) method, as shown in FIG. 12.

Figure 13:
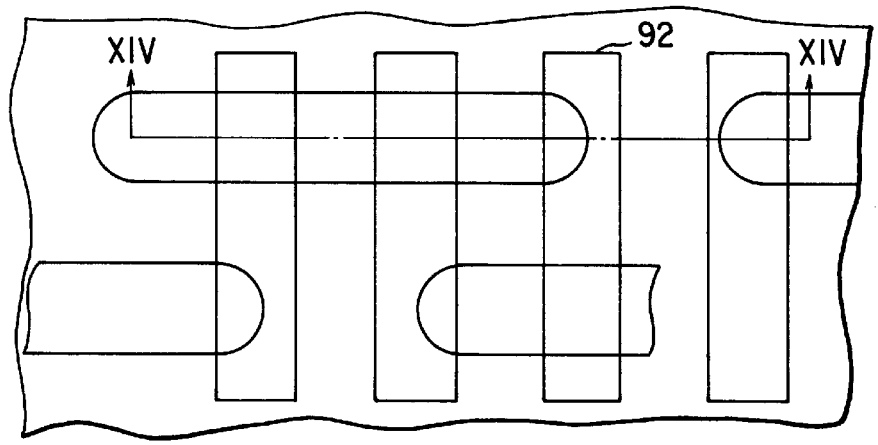
FIG. 13 is a plan view showing the pattern of a mask for use in a process for manufacturing a DRAM cell according to a seventh embodiment of the present invention.
Figure 14:
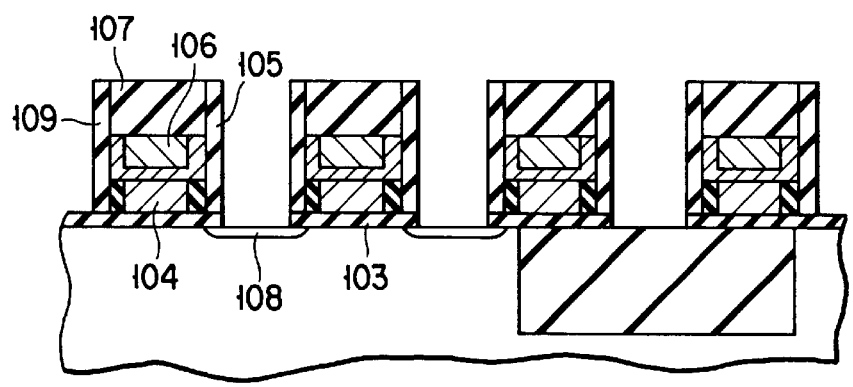
FIG. 14 is a cross sectional view showing a DRAM cell which is formed by using the mask shown in FIG. 13.

Then, a gate oxide film 103 is formed on the surface of the semiconductor substrate 101, and then a method similar to that according to the second embodiment and the gate electrodes pattern 92 shown in FIG. 13 are used to pattern gate electrodes in the form of a laminate composed of a polysilicon film 104, a barrier metal 105, a tungsten film 106 and a silicon nitride film 107, as shown in FIG. 14. Then, the gate electrodes are used as a mask to implant N-type impurities so that source/drain diffusion layers 108 are formed. Then, silicon nitride films 109 are formed on the side walls of the gate electrodes.

Then, as shown in FIG. 15, a silicon oxide film 110 is deposited on the overall surface, and then the silicon oxide film 110 is polished until silicon nitride films 36 are exposed by the CMP method so that the surface is flattened.

Then, a poly plug pattern 93 shown in FIG. 16 is set to etch the silicon oxide films 110 under the condition that a high selection ratio with respect to the silicon nitride films 107 and 109 is realized so that contact holes are formed in a self alignment manner with respect to the gate electrodes. Then, a polysilicon film 111 is deposited on the overall surface as shown in FIG. 17 so that the contact holes are fully filled up. Then, the CMP method is employed to polish the polysilicon film 111 until the silicon nitride films 107 are exposed so that the surface is flattened.

Then, a silicon oxide film 112 is formed on the overall surface, and then a bit-line contact pattern 94 shown in FIG. 18 is used to form a contact hole 113, as shown in FIGS. 19 and 20.

Figure 21:
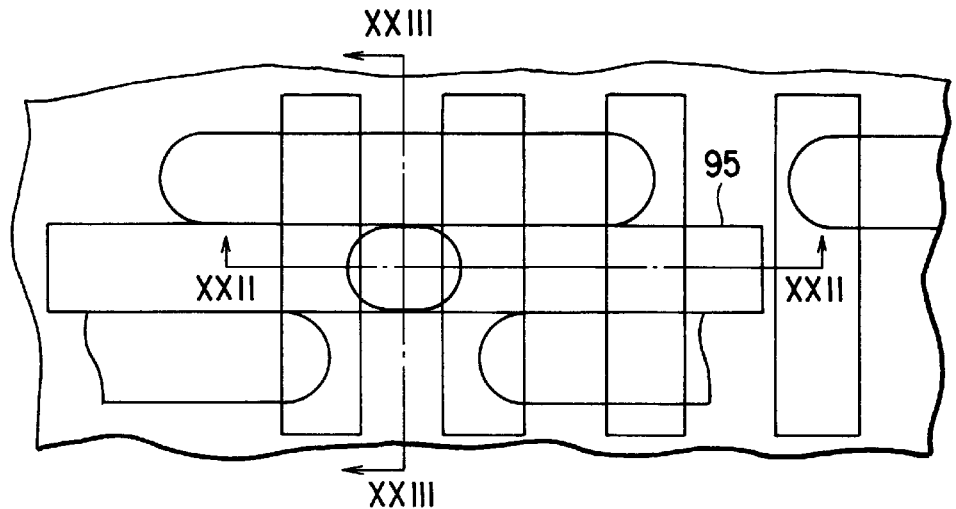
FIG. 21 is a plan view showing the pattern of a mask which is used in a process for forming a DRAM cell according to a seventh embodiment of the present invention.

Then, a bit line pattern 95 shown in FIG. 21 is used to form trenches in the silicon oxide film 112 by the known Damascene method, and then a silicon nitride film 114 is deposited to have a thickness with which the trenches are not filled up. Then, the overall surface is etched by the RIE method so that side walls in the form of silicon nitride films 114 are formed on the side walls of the trenches.

Figure 22:
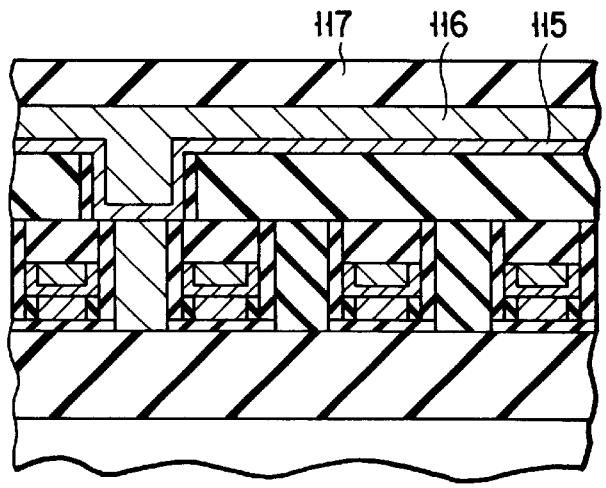
FIG. 22 is a cross sectional view showing an intermediate process for forming a DRAM cell by using the mask shown in FIG. 21.
Figure 23:
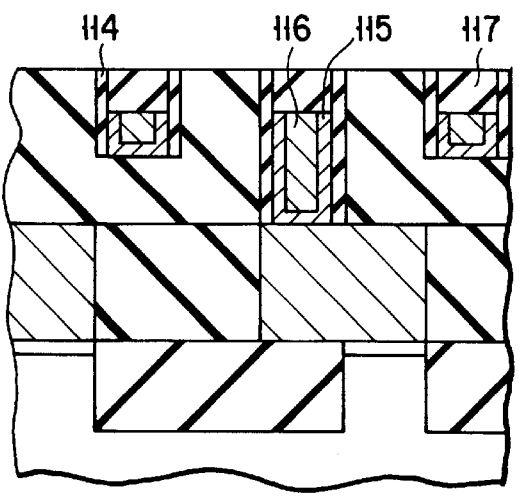
FIG. 23 is a cross sectional view showing an intermediate process for forming a DRAM cell by using the mask shown in FIG. 21.

Then, as shown in FIGS. 22 and 23, a barrier metal 115 and a tungsten film 116 are deposited so that the trenches are filled up. Then, the CMP method is employed to polish the tungsten film 116 and barrier metal 115 until the silicon oxide films 112 are exposed so that the surface is flattened. Simultaneously, a bit lines in the form of the tungsten films 116 are formed. Then, the RIE method is employed to selectively etch the tungsten films 116 and the barrier metals 115 so that stepped portions similar to that according to the second embodiment is formed. Then, silicon nitride film 117 is deposited to fill up the stepped portions, and then the CMP method is employed to polish the silicon nitride film 117 until the silicon oxide films 112 are exposed so that the surface is flattened.

Figure 24:
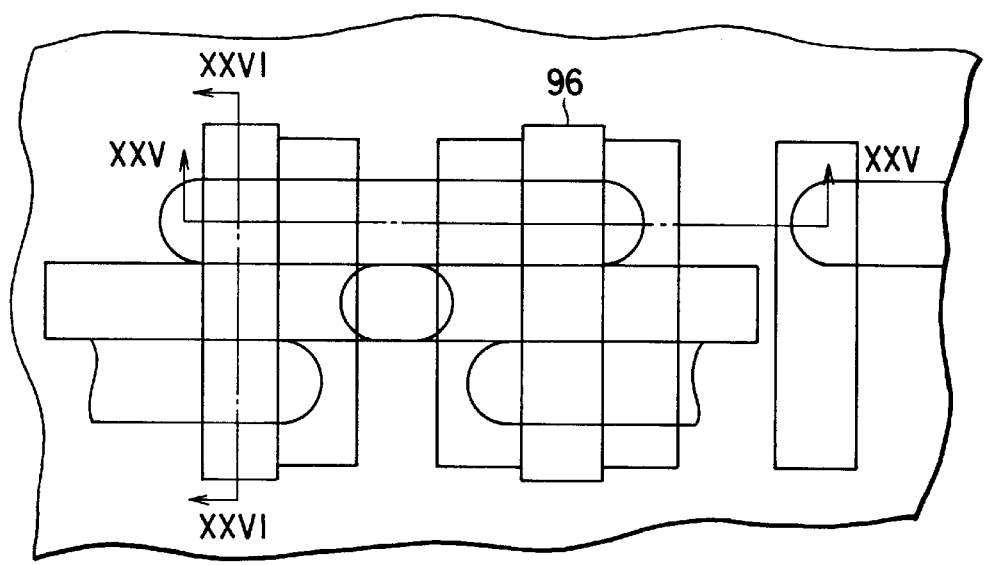
FIG. 24 is a plan view showing the pattern of a mask for use in a process for manufacturing a DRAM cell according to the seventh embodiment of the present invention.
Figures 25, 26:
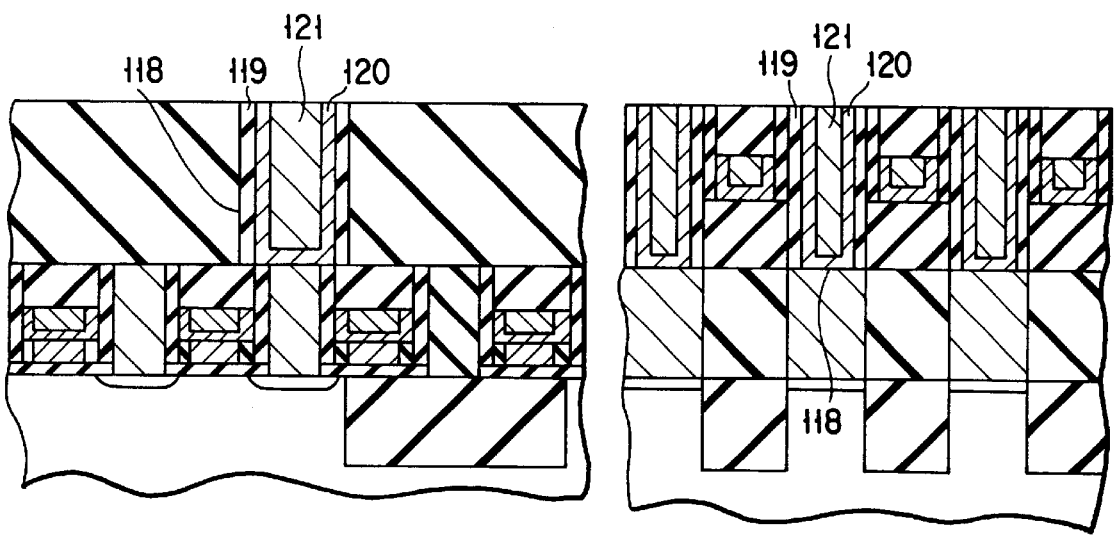
FIG. 25 is a cross sectional view showing an intermediate process for forming a DRAM cell by using the mask shown in FIG. 24.
FIG. 26 is a cross sectional view showing an intermediate process for forming the DRAM cell by using the mask shown in FIG. 24.

Then, a storage node contact pattern 96 shown in FIG. 24 is used to etch the silicon oxide films 112 by the RIE method under condition with which a high selection ratio can be realized with respect to the silicon nitride films 117, as shown in FIGS. 25 and 26. Thus, contact holes 118 are formed. Then, silicon nitride films 119 are deposited, and then the RIE method is similarly employed to perform etching back so that side walls in the form of the silicon nitride films 119 are formed on the side walls of the contact holes 118. Then, a barrier metal 120 and a tungsten film 121 are sequentially deposited so that the contact holes 118 are filled up. Then, the CMP method is employed to polish the tungsten film 121 and the barrier metal 120 until the silicon oxide films 112 and the silicon nitride films 117 are exposed so that the surface is flattened.

Then, a ruthenium film 122 to be formed into the lower electrodes of the capacitor is deposited by the sputtering method, and then a storage node pattern 97 shown in FIG. 27 is used to form storage node electrodes in the form of the ruthenium film 122. Then, as shown in FIG. 28, a BSTO (Barium strontium titanium oxide) film 123 and a ruthenium film 124 to be formed into the upper electrodes are deposited so that a memory capacitor is formed. Then, a known method is employed to form a wiring layer so that a DRAM is manufactured.

Also the seventh embodiment attains an effect similar to that obtainable from the sixth embodiment. A fact has been disclosed in the above-mentioned document "K. Noda et al., "A Boosted Dual Word-line Decoding Scheme for 256 Mb DRAMs" 1992 Symposium on VLSI Circuits Digest of Technical Papers, pp. 112–113, 1992" that combination with an STC capacitor type DRAM attains a significant effect because the stepped portion exists between the memory cell portion and the peripheral circuit portion.

An eighth embodiment of the present invention will now be described with reference to FIGS. 29A to 29E.

In this embodiment, a gate insulation film 12 is initially formed on a P-type semiconductor substrate 11 as shown in FIG. 29A, and then a polysilicon film 13 having N-type impurities doped thereto is deposited on the overall surface. Then, the known lithography method and the RIE method are employed to pattern the gate electrodes.

Then, as shown in FIG. 29B, the gate electrodes are used as a mask to implant N-type impurities, such as P ions or As ions, so that source/drain diffusion layers 14 are formed on the semiconductor substrate 11. Then, RIE damages or ion implantation damages are restored by oxidizing so that oxide films 15 are formed on the surface on which the gate electrodes are exposed.

Then, as shown in FIG. 29C, the silicon oxide film 17 is deposited on the overall surface, and then the silicon oxide film 17 is polished by the CMP method until the gate electrodes are exposed so that the surface is flattened.

Then, as shown in FIG. 29D, the RIE method is employed to selectively etch the polysilicon films 13 so as to form stepped portions 18 from the silicon oxide films 17.

Then, as shown in FIG. 29E, a barrier metal 19 made of TiN or WN is deposited on the overall surface by the sputtering method to have a thickness with which the stepped portions 18 are not completely filled up. Then, a refractory metal film, for example, a tungsten film 20 is deposited on the overall surface by the CVD method so that the stepped portions 18 are fully filled up. Then, the CMP method is employed to polish the tungsten film 20 and the barrier metals 19 until the silicon oxide films 17 are exposed so that the surface is flattened.

Since the gate electrodes are made of metal as described above, metal gate transistors which attempt to lower the sheet resistance can be formed.

A ninth embodiment of the present invention will now be described with reference to FIGS. 30A to 30E.

Figures 30A, 30B, 30C, 30D, 30E:
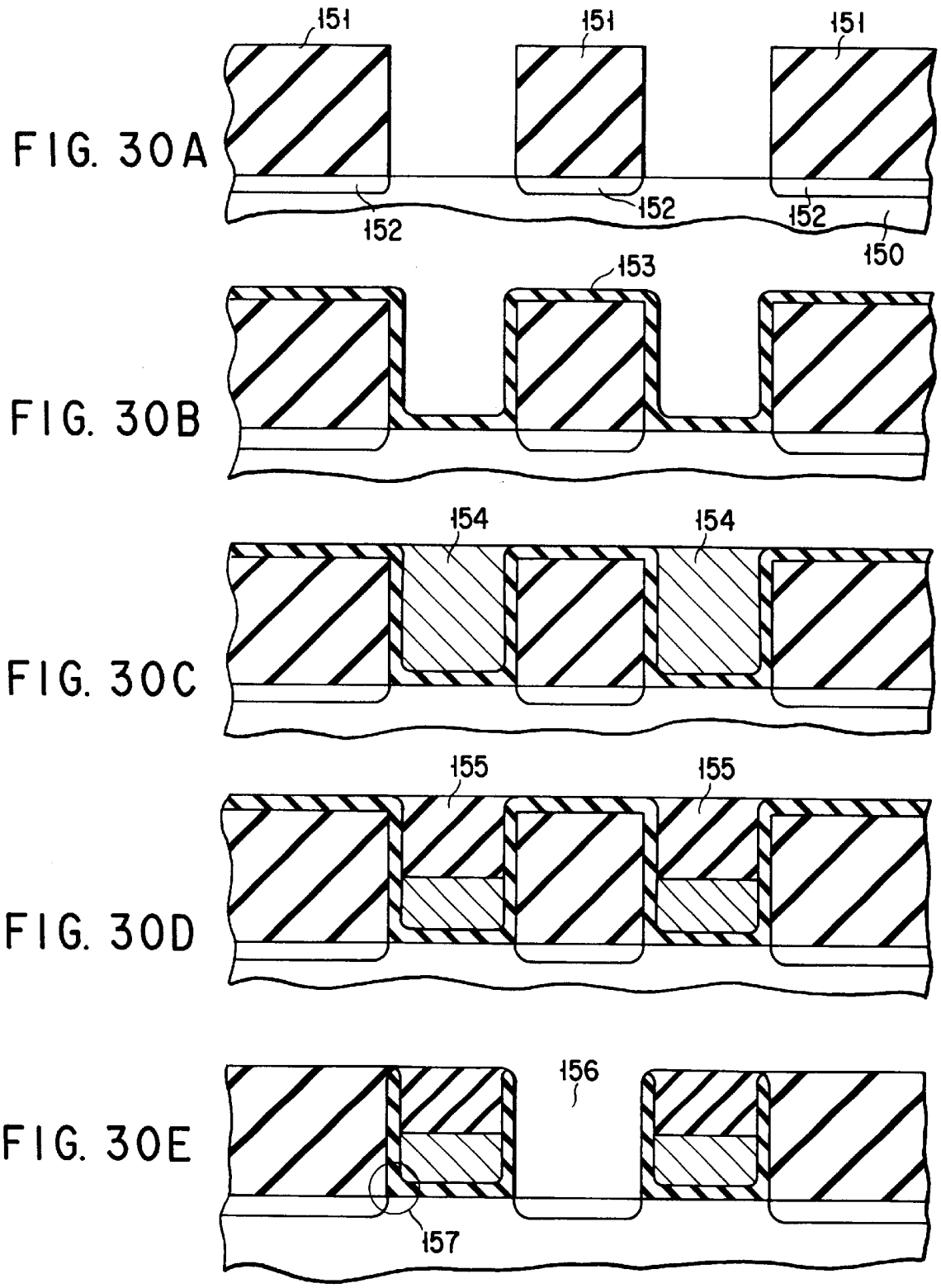
FIGS. 30A to 30E are cross sectional views showing a process for manufacturing a MOSFET according to a ninth embodiment of the present invention.

In the method according to this embodiment, a silicon oxide film 151 having N-type impurities (for example, AsSG or PSG) is deposited on a P-type silicon semiconductor substrate 150 to have a predetermined thickness, as shown in FIG. 30A. The silicon oxide film 151 is patterned by using a predetermined mask pattern so that a plurality of silicon oxide films 151 apart from one other for predetermined intervals are formed. Then, the N-type impurities contained in each silicon oxide film 151 are diffused in the semiconductor substrate 150 so that source/drain diffusion layers 152 are formed. In this case, the source/drain diffusion layers are first formed by ion implantation, using the dummy film shown in FIGS. 29A–29C as a mask, and then the passivation film is formed. The dummy film may be removed after the formation of a passivation film.

Then, as shown in FIG. 30B, a gate insulation film 153 made of any one of SiN, $Ta_2O_5$, STO ($SrTiO_3$) or BSTO ($Ba_xSr_{1-x}TiO_3$) is deposited on the overall surface to have a predetermined thickness.

Then, a tungsten film 154 is deposited on the overall surface, and then flattened by the CMP method, as shown in FIG. 30C. As a result, portions between the silicon oxide films 151 are filled up by the tungsten films 154.

Then, as shown in FIG. 30D, the tungsten films 154 are etched in the direction of the depth thereof to have a predetermined thickness to form stepped portions from the silicon oxide films 151. Then, a silicon nitride film 155 is deposited on the overall surface to fill up the stepped portions. Then, the CMP method is employed to polish the silicon nitride films 155 so that the surface is flattened. As a result, a gate electrodes are formed.

Then, a predetermined contact hole pattern is used to etch the gate insulation film 153 and to etch the silicon oxide films 151 formed below the gate insulation film 153 by the RIE method under condition with which a high selective ratio with respect to the silicon nitride films 155 and the gate insulating film 153 are realized so that contact holes 156 adjacent to the gate electrodes are formed, as shown in FIG. 30E.

Then, similarly to the process shown in, for example, FIG. 2J, the inside portion of the contact hole 156 is filled up with, for example, a polysilicon film having impurities doped thereto, and then flattened by the CMP method.

Since the semiconductor device manufactured by the above-mentioned method has the structure such that the gate electrodes are made of metal (the tungsten film 154), the sheet resistance can be lowered.

Moreover, the method according to this embodiment forms a structure such that the thickness of an end of the gate insulation film 153, that is, a portion given reference numeral 157 which is in contact with the source/drain diffusion layers 152, is larger than the thicknesses of the other portions. Therefore, dielectric breakdown resistance at the end can be improved. Moreover, the upper portion of the gate insulation film 153 which is in contact with the silicon nitride films 155 is partially etched and thus rounded when the contact hole 156 is formed. Therefore, another effect can be obtained when the inside portion of the contact hole 156 is filled up with the polysilicon film in the next step in that the above-mentioned inside portion can satisfactorily be filled up by the polysilicon film.

As described above, according to the present invention, the semiconductor device capable of forming a contact hole adjacent to the gate electrodes in the self alignment manner and the manufacturing method therefor can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising first and second transistors each having a gate insulation film formed on a semiconductor substrate and a gate electrode formed on said gate insulation film and composed of (i) a lower electrode formed by a first conductive film containing silicon, (ii) a barrier metal layer and (iii) an upper electrode formed by a second conductive film deposited on said barrier metal layer and made of metal, wherein said lower electrodes of said first and second transistors have substantially the same thickness, and said upper electrodes of said first and second transistors are formed of the same material, with said upper electrode of said second transistor having a thickness greater than a thickness of said upper electrode of said first transistor, and wherein a thickness of said gate electrode of said second transistor is greater than a thickness of said gate electrode of said first transistor.

2. The semiconductor device according to claim 1, herein an insulation film made of silicon nitride is formed on said upper electrode of said first transistor.

3. The semiconductor device according to claim 2, further comprising a self-aligned contact adjacent to said first transistor.

4. The semiconductor memory device according to claim 2, wherein said insulation film comprises an upper surface at the same level as said upper electrode of said second transistor.

5. A semiconductor device comprising:

a semiconductor substrate;

a pair of source/drain diffusion layers formed in said semiconductor substrate and separated from each other;

a single insulation film having a flat portion located between said pair of source/drain diffusion layers on said semiconductor substrate and a vertical portion extending upward from a periphery of the flat portion, the flat and vertical portions being continuously formed as one integral film, said insulation film defining a concave section with a substantially U-shaped cross section, the flat portion functioning as a gate insulation film and having edges, each edge in contact with one of said pair of source/drain diffusion layers, inner surfaces of the edges having a predetermined curvature such that the edges of said flat portion have a thickness greater than a thickness of a remaining portion of the flat portion, said insulation film being formed of a material having a dielectric constant equal to or greater than a dielectric constant of silicon nitride;

an electrode formed in the concave section of said insulation film and made of a conductive material; and a film different from said insulation film and formed in contact with an outer side of said insulation film.

6. The semiconductor device according to claim 5, wherein said conductive material is a metal.

7. The semiconductor device according to claim 5, wherein said insulation film is formed of a material which includes one of SiN, $Ta_2O_5$, STO($SrTiO_3$) and BSTO ($Ba_xSr_{i-x}TiO_3$).

8. The semiconductor device according to claim 5, wherein the edges of the flat portion have a thickness greater than a thickness of the vertical portion.

9. The semiconductor memory device according to claim 5, wherein said film is an insulation film.

10. A semiconductor device comprising:

a semiconductor substrate;

a pair of source/drain diffusion layers formed in said semiconductor substrate and separated from each other;

an insulation film having a flat portion located between said pair of source/drain diffusion layers on said semiconductor substrate and a vertical portion extending upward from a periphery of the flat portion, the flat and vertical portions being continuously formed as one integral film, said insulation film defining a concave section with a substantially U-shaped cross section, the flat portion functioning as a gate insulation film and having edges, each edge in contact with one of said pair of source/drain diffusion layers, inner surfaces of the edges having a predetermined curvature such that the edges of said flat portion have a thickness greater than a thickness of a remaining portion of the flat portion, said insulation film being formed of a material having a dielectric constant equal to or greater than a dielectric constant of silicon nitride;

an electrode formed in the concave section of said insulation film and made of a conductive material; and a film different from said insulation film and formed in contact with an outer side of said insulation film and said semiconductor substrate.

11. The semiconductor device according to claim 10, wherein said conductive material is a metal.

12. The semiconductor device according to claim 10, wherein said insulation film is formed of a material which includes one of SiN, $Ta_2O_5$, STO($SrTiO_3$) and BSTO ($Ba_xSr_{i-x}TiO_3$).

13. The semiconductor device according to claim 10, wherein the edges of the flat portion have a thickness greater than a thickness of the vertical portion.

14. The semiconductor memory device according to claim 10, wherein said film is an insulation film.

* * * * *

UNITED STATES PATENT AND TRADEMARK OFFICE
CERTIFICATE OF CORRECTION

PATENT NO. : 6,608,356 B1
DATED : August 19, 2003
INVENTOR(S) : Yusuke Kohyama et al.

It is certified that error appears in the above-identified patent and that said Letters Patent is hereby corrected as shown below:

Title page,
Item [56], References Cited, U.S. PATENT DOCUMENTS, add:
-- 5,897,365    4/1999      Matsubara      438/592
4,519,051    5/1985      Fuji           257/324
5,489,543    2/1996      Hong           438/291
5,158,903    10/1992     Hori *et al*   438/302
5,766,996    6/1998      Hayakawa *et al* 438/257
5,648,284    7/1997      Kusunoki *et al*  438/286 --

Signed and Sealed this

Twenty-seventh Day of January, 2004

JON W. DUDAS
*Acting Director of the United States Patent and Trademark Office*